United States Patent
Liu et al.

(10) Patent No.: US 11,630,169 B1
(45) Date of Patent: Apr. 18, 2023

(54) FABRICATING A COIL ABOVE AND BELOW A MAGNETORESISTANCE ELEMENT

(71) Applicant: Allegro MicroSystems, LLC, Manchester, NH (US)

(72) Inventors: Yen Ting Liu, Hsinchu (TW); Maxim Klebanov, Palm Coast, FL (US); Paolo Campiglio, Arcueil (FR); Sundar Chetlur, Frisco, TX (US); Harianto Wong, Southborough, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/648,154

(22) Filed: Jan. 17, 2022

(51) Int. Cl.
| | |
|---|---|
| *G01R 33/09* | (2006.01) |
| *H01F 41/12* | (2006.01) |
| *H01F 41/04* | (2006.01) |
| *H01F 27/28* | (2006.01) |
| *H01F 27/32* | (2006.01) |

(52) U.S. Cl.
CPC ......... *G01R 33/098* (2013.01); *G01R 33/093* (2013.01); *H01F 27/2804* (2013.01); *H01F 27/32* (2013.01); *H01F 41/041* (2013.01); *H01F 41/12* (2013.01)

(58) Field of Classification Search
CPC . G01R 33/098; G01R 33/093; H01F 27/2804; H01F 27/32; H01F 41/041; H01F 41/12
See application file for complete search history.

(56) References Cited

U.S. PATENT DOCUMENTS

| | | | |
|---|---|---|---|
| 5,764,052 | A | 6/1998 | Renger |
| 5,831,426 | A | 11/1998 | Black, Jr. et al. |
| 6,473,275 | B1 | 10/2002 | Gill |
| 7,001,783 | B2 | 2/2006 | Costrini et al. |
| 7,259,545 | B2 | 8/2007 | Stauth et al. |
| 7,511,483 | B2 | 3/2009 | Pannetier et al. |
| 7,923,996 | B2 | 4/2011 | Doogue et al. |
| 8,030,918 | B2 | 10/2011 | Doogue et al. |
| 8,447,556 | B2 | 5/2013 | Friedrich et al. |
| 8,542,010 | B2 | 9/2013 | Cesaretti et al. |
| 8,680,846 | B2 | 3/2014 | Cesaretti et al. |
| 8,692,546 | B2 | 4/2014 | Cesaretti et al. |

(Continued)

FOREIGN PATENT DOCUMENTS

| | | |
|---|---|---|
| DE | 10 2006 010 652 A1 | 9/2007 |
| EP | 3 293 889 A1 | 3/2018 |

OTHER PUBLICATIONS

U.S. Appl. No. 17/648,151, filed Jan. 17, 2022, Klebanov et al.

(Continued)

*Primary Examiner* — Alvaro E Fortich
(74) *Attorney, Agent, or Firm* — Daly, Crowley, Mofford & Durkee, LLP

(57) ABSTRACT

In one aspect, a method includes forming a metal layer on a substrate, wherein the metal layer comprises a first coil, forming a planarized insulator layer on the metal layer, forming at least one via in the planarized insulator layer, depositing a magnetoresistance (MR) element on the planarized insulator layer, and forming a second coil extending above the MR element. The at least one via electrically connects to the metal layer on one end and to MR element on the other end.

22 Claims, 27 Drawing Sheets

(56) References Cited

U.S. PATENT DOCUMENTS

| | | | |
|---|---|---|---|
| 8,747,680 | B1 | 6/2014 | Deshpande et al. |
| 8,818,749 | B2 | 8/2014 | Friedrich et al. |
| 8,848,320 | B1 | 9/2014 | David et al. |
| 8,885,302 | B1 | 11/2014 | David et al. |
| 8,907,669 | B2 | 12/2014 | Petrie |
| 9,013,838 | B1 | 4/2015 | Erie et al. |
| 9,151,807 | B2 | 10/2015 | Friedrich et al. |
| 9,201,122 | B2 | 12/2015 | Cesaretti et al. |
| 9,645,220 | B2 | 5/2017 | Cesaretti et al. |
| 9,804,222 | B2 | 10/2017 | Petrie et al. |
| 9,841,485 | B2 | 12/2017 | Petrie et al. |
| 10,050,193 | B1 | 8/2018 | Klebanov et al. |
| 10,074,939 | B1 | 9/2018 | Briano |
| 10,132,879 | B2 | 11/2018 | Latham et al. |
| 10,234,513 | B2 | 3/2019 | Vig et al. |
| 10,396,279 | B2 | 8/2019 | Deshpande et al. |
| 10,451,671 | B2 | 10/2019 | Petrie et al. |
| 10,466,298 | B2 | 11/2019 | Chaware et al. |
| 10,566,526 | B1 | 2/2020 | Liu et al. |
| 10,761,120 | B2 | 9/2020 | Feucht et al. |
| 10,868,240 | B2 | 12/2020 | Liu et al. |
| 10,884,031 | B2 | 1/2021 | Vuillermet et al. |
| 10,908,232 | B2 | 2/2021 | Latham et al. |
| 10,916,438 | B2 | 2/2021 | Klebanov et al. |
| 11,005,036 | B2 | 5/2021 | Liu et al. |
| 11,112,230 | B2 | 9/2021 | Latham et al. |
| 11,115,084 | B2 | 9/2021 | Latham et al. |
| 11,193,989 | B2 | 12/2021 | Campiglio et al. |
| 2003/0042571 | A1 | 3/2003 | Chen et al. |
| 2004/0012056 | A1 | 1/2004 | Nejad et al. |
| 2004/0014243 | A1 | 1/2004 | Drewes |
| 2004/0100727 | A1* | 5/2004 | Sato ............. B82Y 10/00 360/122 |
| 2006/0114607 | A1* | 6/2006 | Pinarbasi ......... G11B 5/3163 360/119.09 |
| 2007/0216408 | A1 | 9/2007 | Ando et al. |
| 2008/0144231 | A1* | 6/2008 | Sato ............. B82Y 25/00 360/324 |
| 2009/0015252 | A1 | 1/2009 | Raberg et al. |
| 2009/0026266 | A1 | 1/2009 | Raggam |
| 2009/0218657 | A1 | 9/2009 | Rofougaran |
| 2011/0008915 | A1 | 1/2011 | Nozieres et al. |
| 2011/0169488 | A1 | 7/2011 | Mather |
| 2011/0187361 | A1* | 8/2011 | Vanhelmont ....... G01R 33/096 324/252 |
| 2013/0032908 | A1 | 2/2013 | Tang et al. |
| 2013/0055052 | A1 | 2/2013 | Kaeriyama |
| 2013/0241543 | A1 | 9/2013 | Stenson et al. |
| 2014/0332914 | A1 | 11/2014 | Liou et al. |
| 2014/0353785 | A1 | 12/2014 | Paci |
| 2015/0084972 | A1 | 3/2015 | Wu et al. |
| 2015/0194597 | A1 | 7/2015 | Fermon et al. |
| 2015/0200355 | A1 | 7/2015 | Erie et al. |
| 2016/0149416 | A1 | 5/2016 | Ha et al. |
| 2016/0164463 | A1 | 6/2016 | Zhou et al. |
| 2016/0202329 | A1* | 7/2016 | Paci ............. G01R 33/093 324/252 |
| 2016/0260772 | A1 | 9/2016 | Usami et al. |
| 2017/0371007 | A1 | 12/2017 | Anderson et al. |
| 2018/0033955 | A1 | 2/2018 | Wong et al. |
| 2018/0074016 | A1 | 3/2018 | Chen et al. |
| 2020/0066580 | A1 | 2/2020 | Peng et al. |
| 2020/0066967 | A1 | 2/2020 | Suri et al. |
| 2020/0266337 | A1 | 8/2020 | Liu et al. |
| 2021/0057642 | A1 | 2/2021 | Liu et al. |

OTHER PUBLICATIONS

Analog Devices, "5.0 kV rms Quad Digital Isolators;" Data Sheet ADuM240D/ADuM240E/ADuM241D/ADuM241E/ADuM242D/ADuM242E; Retrieved from www.analog.com; Jan. 2016; 26 Pages.

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.

Daughton, "Spin-Dependent Sensors;" Invited Paper, Proceedings of the IEEE, vol. 91, No. 5; May 2003; pp. 681-686; 6 Pages.

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.microchem.com/Prod-PMGI_LOR.htm; Feb. 14, 2012; 2 Pages.

NVE Corporation, "High Speed Digital Isolators;" IL710; Rev. AE; Retrieved from www.IsoLoop.com; Nov. 2016; 14 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

Non-Final Office Action dated Mar. 24, 2017 from U.S. Appl. No. 15/219,694; 17 Pages.

Response to Office Action dated Mar. 24, 2017 for U.S. Appl. No. 15/219,694, filed Jun. 22, 2017; 12 Pages.

Restriction Requirement dated Apr. 21, 2017 for U.S. Appl. No. 15/195,124; 5 Pages.

Response to Restriction Requirement dated Apr. 21, 2017 for U.S. Appl. No. 15/195,124, filed May 18, 2017; 1 Page.

Non-Final Office Action dated Jul. 14, 2017 for U.S. Appl. No. 15/195,124; 7 Pages.

U.S. Restriction Requirement dated Oct. 3, 2019 for U.S. Appl. No. 16/122,019; 4 Pages.

Response to U.S. Restriction Requirement dated Oct. 3, 2019 for U.S. Appl. No. 16/122,019; Response filed Oct. 7, 2019; 1 Page.

U.S. Ex Parte Quayle Action dated Oct. 22, 2019 for U.S. Appl. No. 16/122,019; 7 Pages.

Response to U.S. Ex Parte Quayle Action dated Oct. 22, 2019 for U.S. Appl. No. 16/122,019; Response filed Oct. 22, 2019; 7 Pages.

U.S. Notice of Allowance dated Nov. 25, 2019 for U.S. Appl. No. 16/122,019; 5 Pages.

PCT International Search Report and Written Opinion dated Dec. 12, 2019 for International Application No. PCT/US2019/053054; 14 Pages.

U.S. Ex Parte Quayle Action dated Mar. 10, 2021 U.S. Appl. No. 16/732,679; 6 Pages.

Response to U.S. Ex Parte Quayle Action dated Mar. 10, 2021 U.S. Appl. No. 16/732,679; Response filed Mar. 16, 2021; 8 Pages.

U.S. Notice of Allowance dated Mar. 24, 2021 U.S. Appl. No. 16/732,679; 5 Pages.

PCT International Preliminary Report dated Jun. 10, 2021 for International Application No. PCT/US2019/053054; 10 Pages.

European Communication Pursuant to Rules 161 and 162 dated Mar. 30, 2021 for European Application No. 19786422.6; 3 Pages.

Response to European Communication Pursuant to Rules 161 and 162 dated Mar. 30, 2021 for European Application No. 19786422.6; Response filed Sep. 27, 2021; 9 Pages.

1st U.S. Non-Final Office Action dated Sep. 25, 2019 for U.S. Appl. No. 16/200,799; 12 Pages.

Response to 1st U.S. Non-Final Office Action dated Sep. 25, 2019 for U.S. Appl. No. 16/200,799; Response filed Dec. 18, 2019; 15 Pages.

1st U.S. Final Office Action dated Jan. 17, 2020 for U.S. Appl. No. 16/200,799; 13 Pages.

Response to 1st U.S. Final Office Action dated Jan. 17, 2020 for U.S. Appl. No. 16/200,799; Response filed Apr. 13, 2020; 14 Pages.

2nd U.S. Non-Final Office Action dated Jun. 23, 2020 for U.S. Appl. No. 16/200,799; 14 Pages.

Response to 2nd U.S. Non-Final Office Action dated Jun. 23, 2020 for U.S. Appl. No. 16/200,799; Response filed Sep. 8, 2020; 10 Pages.

2nd U.S. Final Office Action dated Dec. 8, 2020 for U.S. Appl. No. 16/200,799; 13 Pages.

Appeal Brief filed on Mar. 9, 2021 for U.S. Appl. No. 16/200,799; 21 Pages.

U.S. Notice of Allowance dated Jun. 16, 2021 for U.S. Appl. No. 16/200,799; 6 Pages.

U.S. Appl. No. 17/218,315, filed Mar. 31, 2021, Rubinsztain et al.

(56) References Cited

OTHER PUBLICATIONS

U.S. Appl. No. 16/047,342, filed Jul. 27, 2018, Campiglio et al.
U.S. Non-Final Office Action dated Jun. 13, 2019 for U.S. Appl. No. 15/600,186; 15 Pages.
U.S. Non-Final Office Action dated Jun. 14, 2019 for U.S. Appl. No. 15/991,491; 15 Pages.
U.S. Restriction Requirement dated Feb. 7, 2020 for U.S. Appl. No. 16/280,199; 6 Pages.
Response to U.S. Restriction Requirement dated Feb. 7, 2020 for U.S. Appl. No. 16/280,199; Response Filed Feb. 26, 2020; 1 Page.
U.S. Non-Final Office Action dated Mar. 27, 2020 for U.S. Appl. No. 16/280,199; 10 Pages.
Response to U.S. Non-Final Office Action dated Mar. 27, 2020 for U.S. Appl. No. 16/280,199; Response Filed Jun. 25, 2020; 10 Pages.
U.S. Notice of Allowance dated Aug. 26, 2020 for U.S. Appl. No. 16/280,199; 13 Pages.
PCT International Search Report and Written Opinion of the ISA dated Sep. 26, 2019 for International Application No. PCT/US2019/037629; 13 Pages.
PCT International Preliminary Report dated Feb. 11, 2021 for International Application No. PCT/US2019/037629; 8 Pages.
U.S. Restriction Requirement dated May 8, 2020 for U.S. Appl. No. 16/047,342; 6 Pages.
Response to Restriction Requirement filed on Jun. 24, 2020 for U.S. Appl. No. 16/047,342; 1 page.
Office Action dated Oct. 14, 2020 for U.S. Appl. No. 16/047,342; 10 pages.
Response to Office Action filed on Dec. 29, 2020 for U.S. Appl. No. 16/047,342; 14 pages.
Final Office Action dated May 5, 2021 for U.S. Appl. No. 16/047,342; 15 pages.
Response to U.S. Final Office Action dated May 5, 2021 for U.S. Appl. No. 16/047,342; Response filed Jul. 2, 2021; 15 Pages.
Advisory Action dated Jul. 15, 2021 for U.S. Appl. No. 16/047,342; 2 Pages.
Preliminary Amendment (Supplemental Amendment) filed on Sep. 27, 2021 for U.S. Appl. No. 16/047,342; 10 Pages.
U.S. Notice of Allowance dated Oct. 1, 2021 for U.S. Appl. No. 16/047,342; 11 Pages.
Response (with Amended Claims) to European Communication dated Mar. 10, 2021 for European Application No. 19735086.1; Response filed Sep. 14, 2021; 27 Pages.
U.S. Non-Final Office Action dated Aug. 10, 2021 for U.S. Appl. No. 17/089,798; 9 Pages.
Response to U.S. Non-Final Office Action dated Aug. 10, 2021 for U.S. Appl. No. 17/089,798; Response filed Oct. 12, 2021; 7 Pages.
U.S. Final Office Action dated Nov. 15, 2021 for U.S. Appl. No. 17/089,798; 10 Pages.

* cited by examiner

FABRICATING A COIL ABOVE AND BELOW A MAGNETORESISTANCE ELEMENT

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a method includes forming a metal layer on a substrate, wherein the metal layer comprises a first coil, forming a planarized insulator layer on the metal layer, forming at least one via in the planarized insulator layer, depositing a magnetoresistance (MR) element on the planarized insulator layer, and forming a second coil extending above the MR element. The at least one via electrically connects to the metal layer on one end and to MR element on the other end.

In another aspect, a magnetic field sensor including a substrate, a metal layer on the substrate and including a first coil, a planarized insulator layer on the metal layer, a magnetoresistance (MR) element on the planarized insulator layer, at least one via in the planarized insulator layer that electrically connects to the metal layer on one end and to the MR element at the other end, and a second coil extending above the MR element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a coil above and below a magnetoresistance (MR) element. The techniques described herein allow an MR element to sense changes in a magnetic field above or below the MR element. By having a coil underneath an MR element and manufactured before the MR element enables the use of high temperature deposition of the coil with improved metal step coverage and higher coil densities.

Figure 1A:
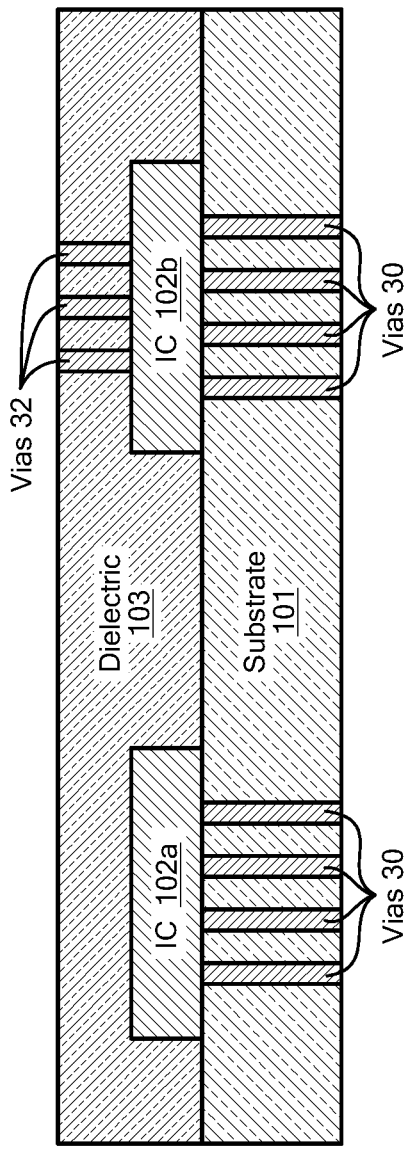
FIGS. 1A to 1Z are diagrams of one example to fabricate a coil above and below a magnetoresistance (MR) element.

Referring to FIG. 1A, a substrate 101 includes vias 30 connected to integrated circuits (ICs) (e.g., an IC 102a, an IC 102b). In one example, the vias 30 include electroconductive material (e.g., tungsten, aluminum, copper and so forth). A dielectric 103 is deposited on the substrate 101 and the dielectric 103 encapsulates the ICs 102a, 102b. In some examples the dielectric 103 may be a substrate.

Vias 32 connect to the IC 102b on the opposite side that connects to the vias 30. In one example, the vias 32 include electroconductive material (e.g., tungsten, aluminum, copper and so forth).

Figure 1B:
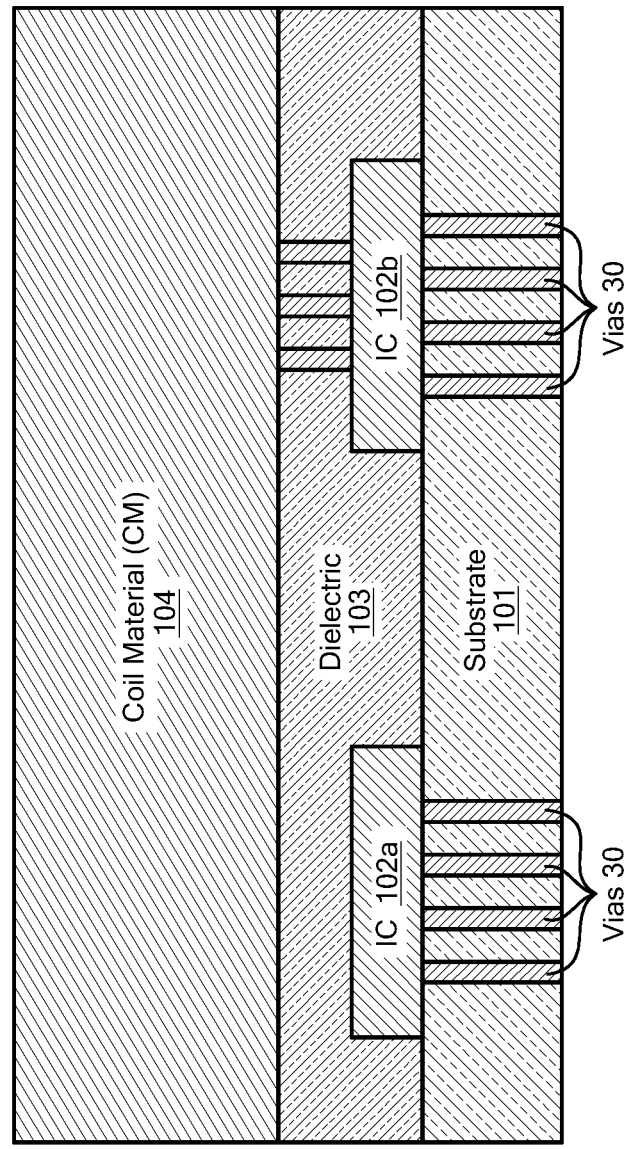

Referring to FIG. 1B, a coil material 104 is deposited on to the dielectric 103 and the vias 32. The coil material 104 includes electroconductive material. For example, the electroconductive material in the coil material 104 may include one or more of titanium nitride (TiN), aluminum, copper, gold, platinum and so forth.

Figure 1C:
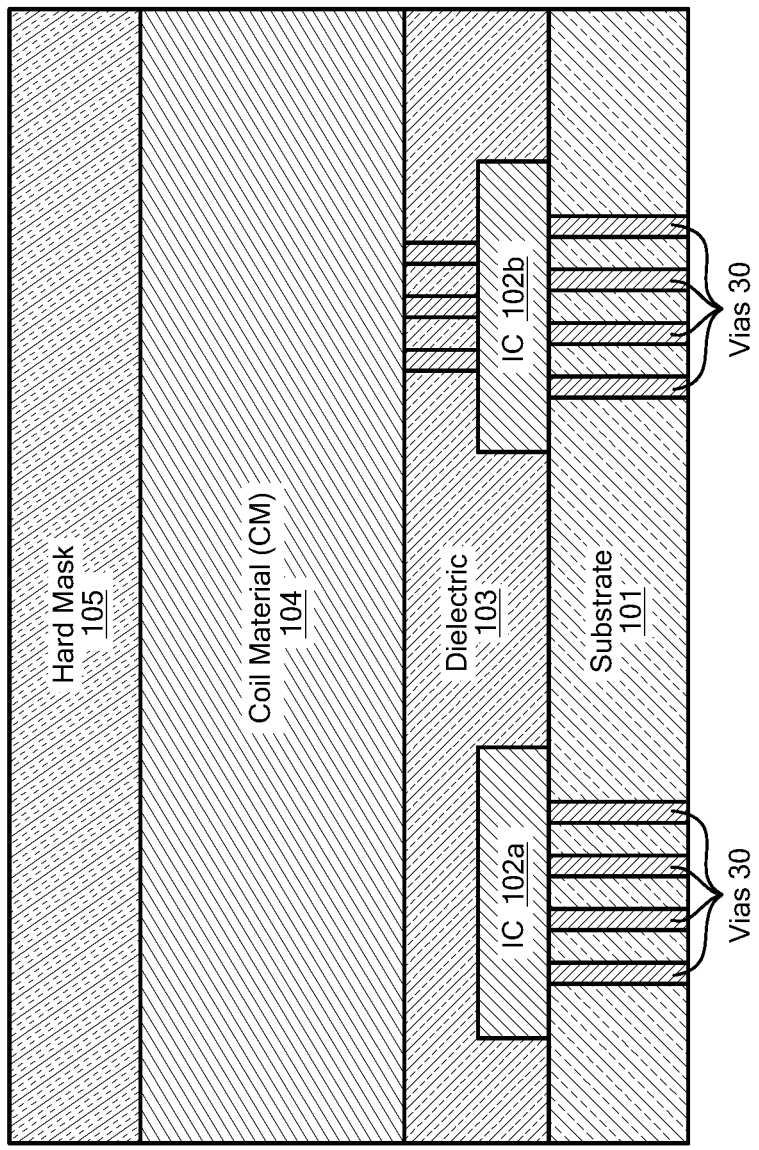
Figure 1D:
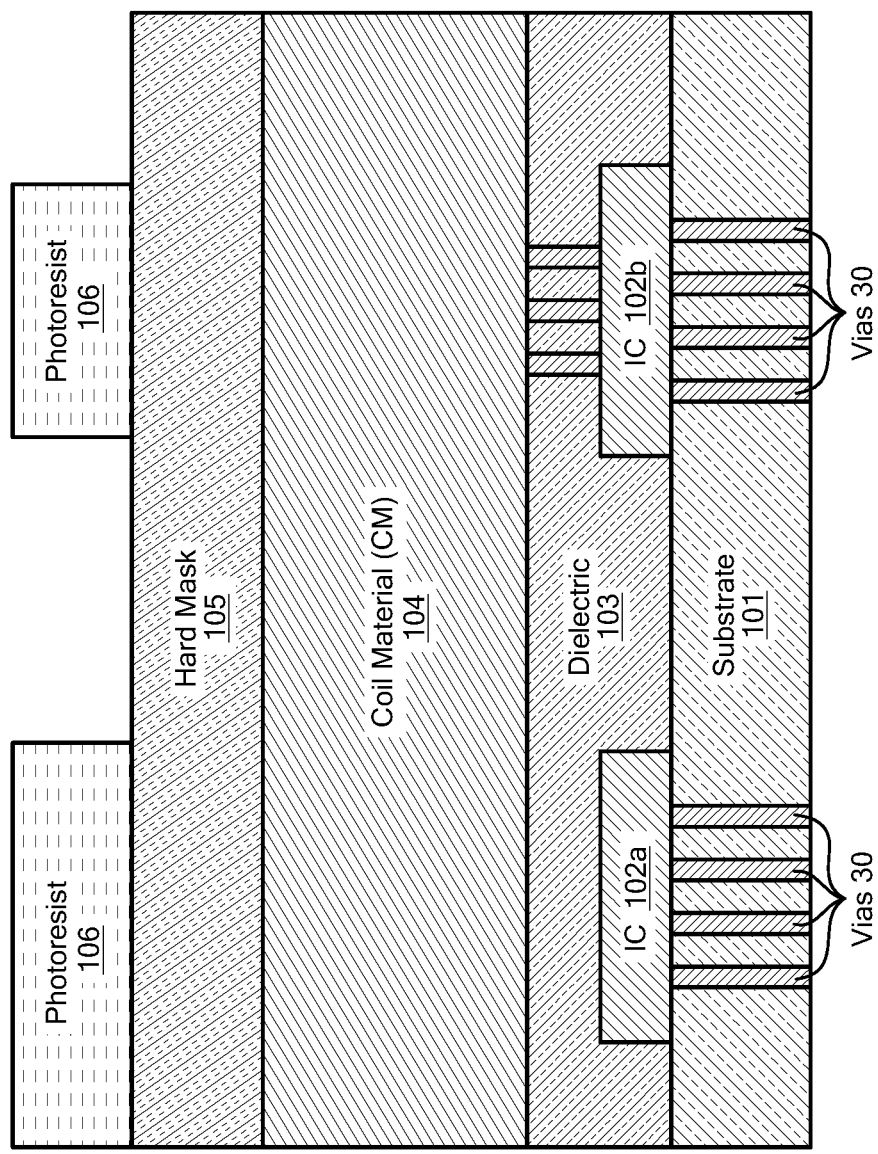
Figure 1E:
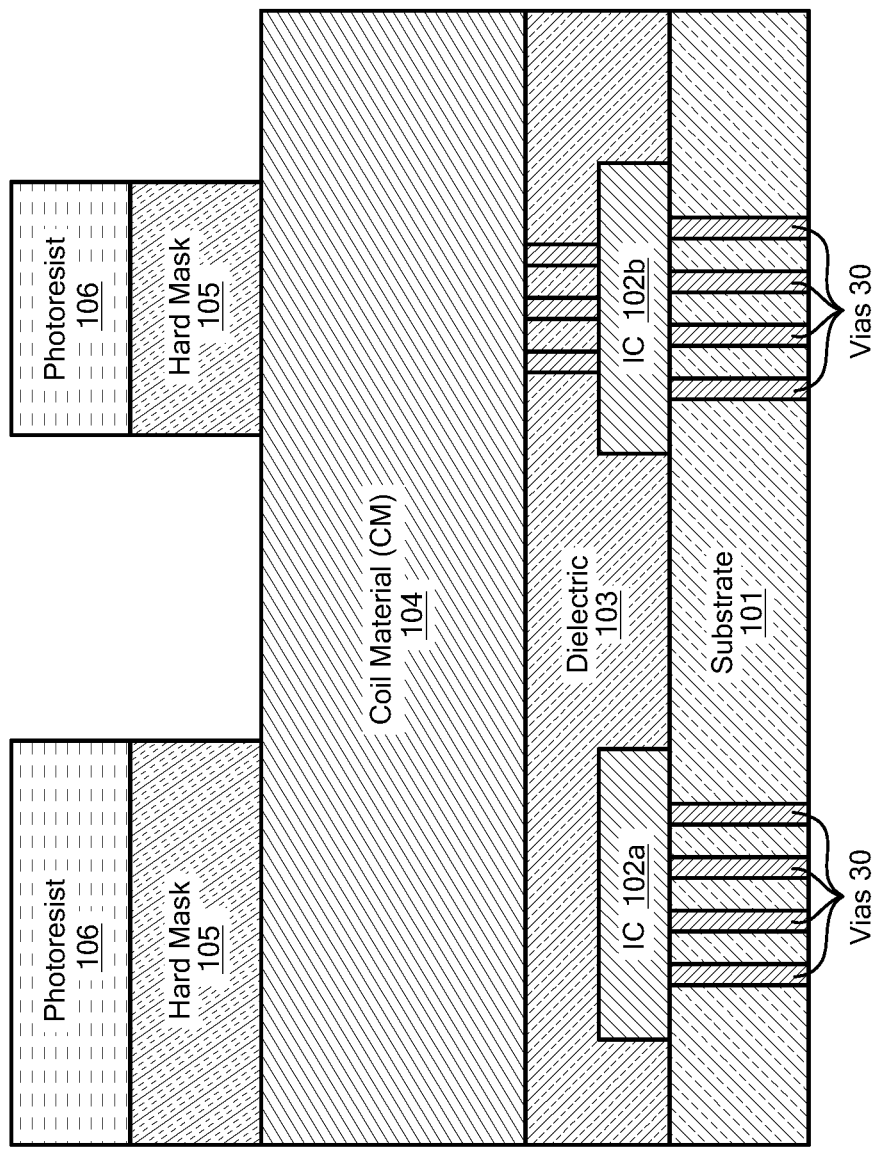
Figure 1F:
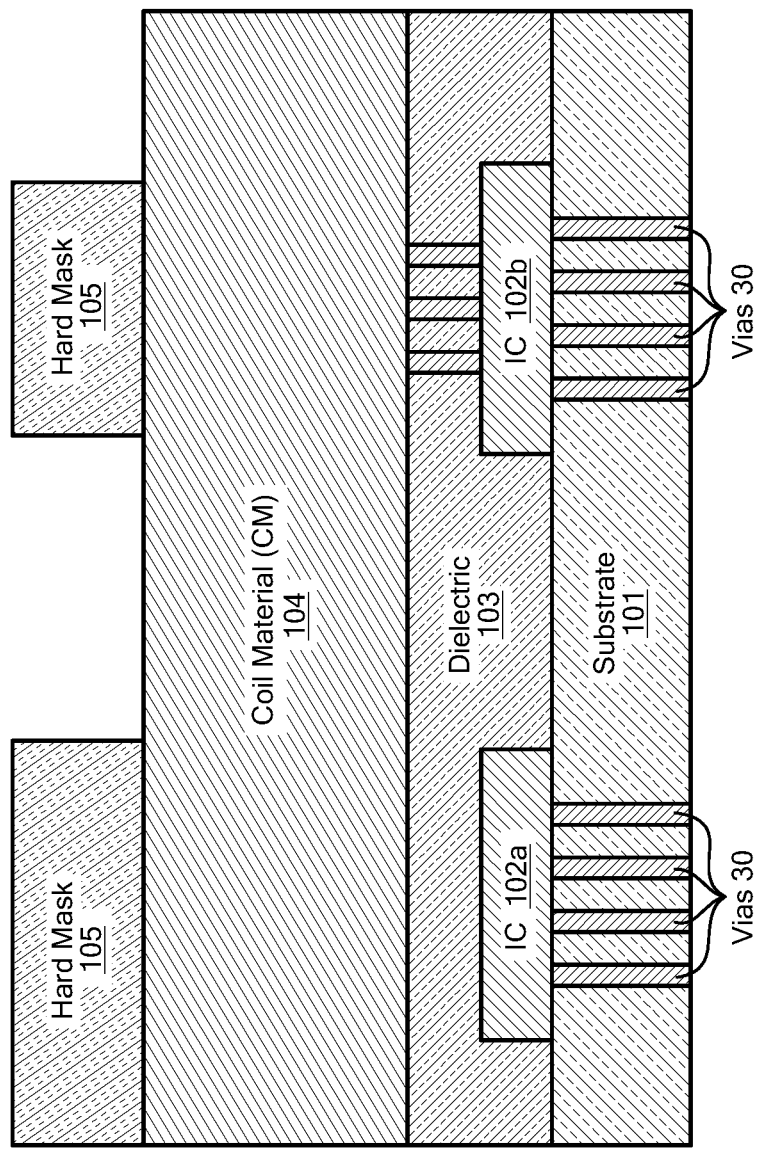
Figure 1G:
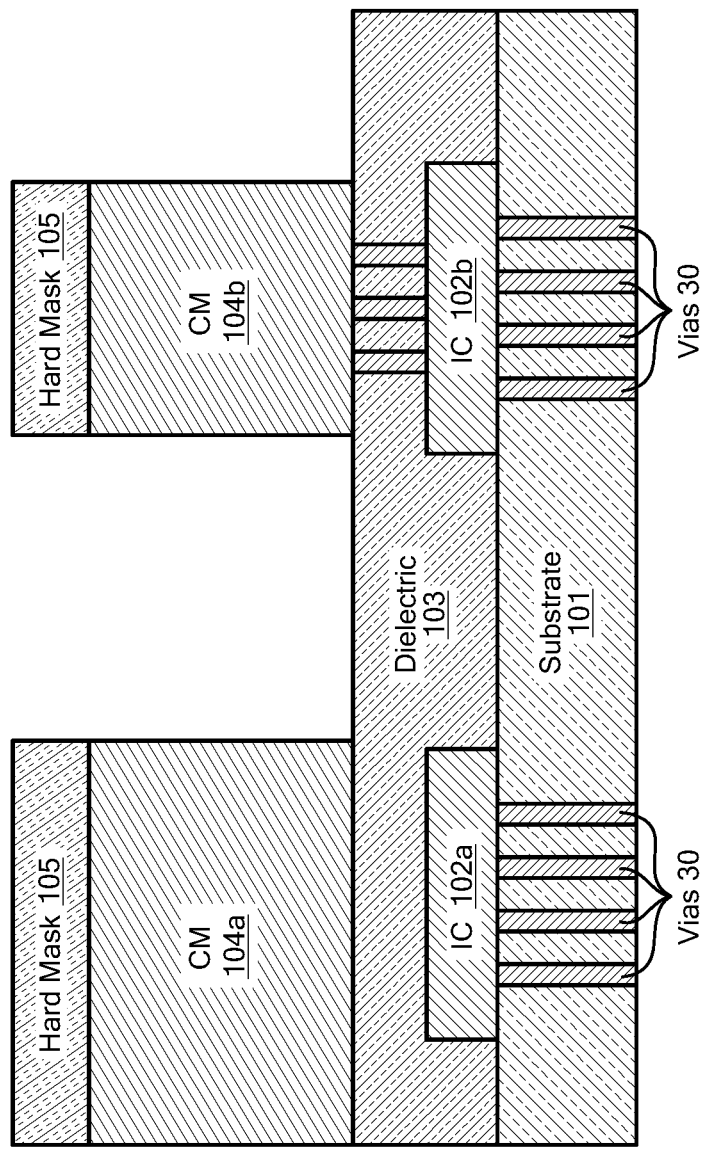

As will be further described, the coil material 104 will be etched to form a coil (see, for example, FIG. 1G and so forth). Electrical signals may be conducted through vias (not shown) to the coil. In one example, the electrical signals may be used to generate a magnetic field from the coil. In other examples, the coil may be used to pick-up an induced electromotive force caused by a changing magnetic field received at the coil.

In some embodiments, the substrate 101 may include any material suitable for supporting electronic circuitry. In some embodiments, the substrate 101 may include a semiconductor material, including but not limited to silicon, germanium, gallium arsenide, and/or other types of semiconductor materials. In other embodiments, the substrate 101 may include diamond, glass, ceramic, polymer and/or other materials. In one particular example, the substrate 101 is silicon dioxide or silicon nitride. In other examples, the substrate 101 may include both semiconductor and non-semiconductor materials.

Referring to FIG. 1C, a hard mask 105 is deposited on the coil material 104. In one example, the hard mask 105 includes silicon dioxide.

Referring to FIG. 1D, a photoresist is deposited on the hard mask 105. The photoresist is patterned using photolithography to expose regions of the hard mask 105 that will be removed to further define the coil in subsequent processing. The remaining photoresist 106 protects the portions of the hard mask 105 that will not be removed and is not exposed.

Referring to FIG. 1E, the exposed portions of the hard mask 105 are removed thereby leaving exposed portions of the coil material 104. Referring to FIG. IF, the photoresist 106 is removed.

Referring to FIG. 1G, the exposed portions of the coil material 104 are removed leaving coil material 104a, coil material 104b. The coil material 104a is used to form the coil and the coil material 104b is a connector to the vias 32.

Figure 1H:
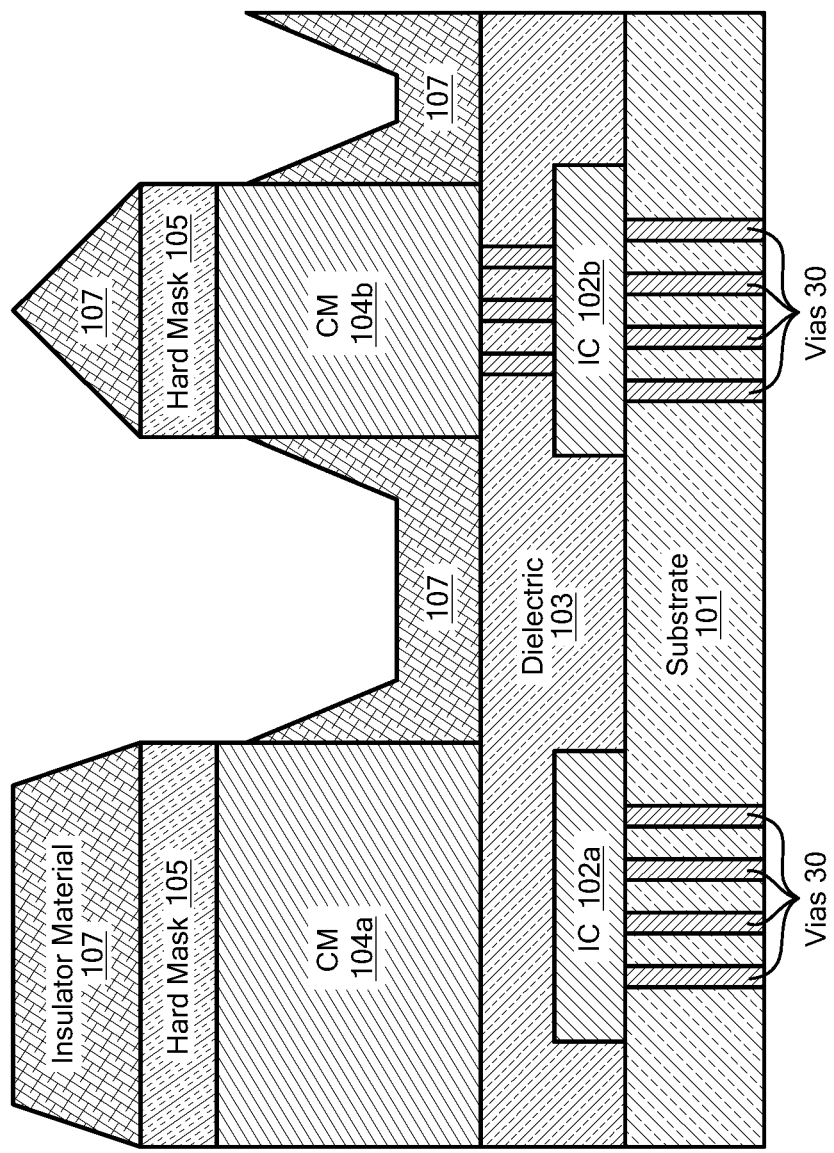

Referring to FIG. 1H, an insulator material 107 is deposited on the hard mask 105, in the gaps of the between coil material 104a and coil material 104b, and on the dielectric 103. In one example, the insulator material 107 is silicon dioxide.

Figure 1I:
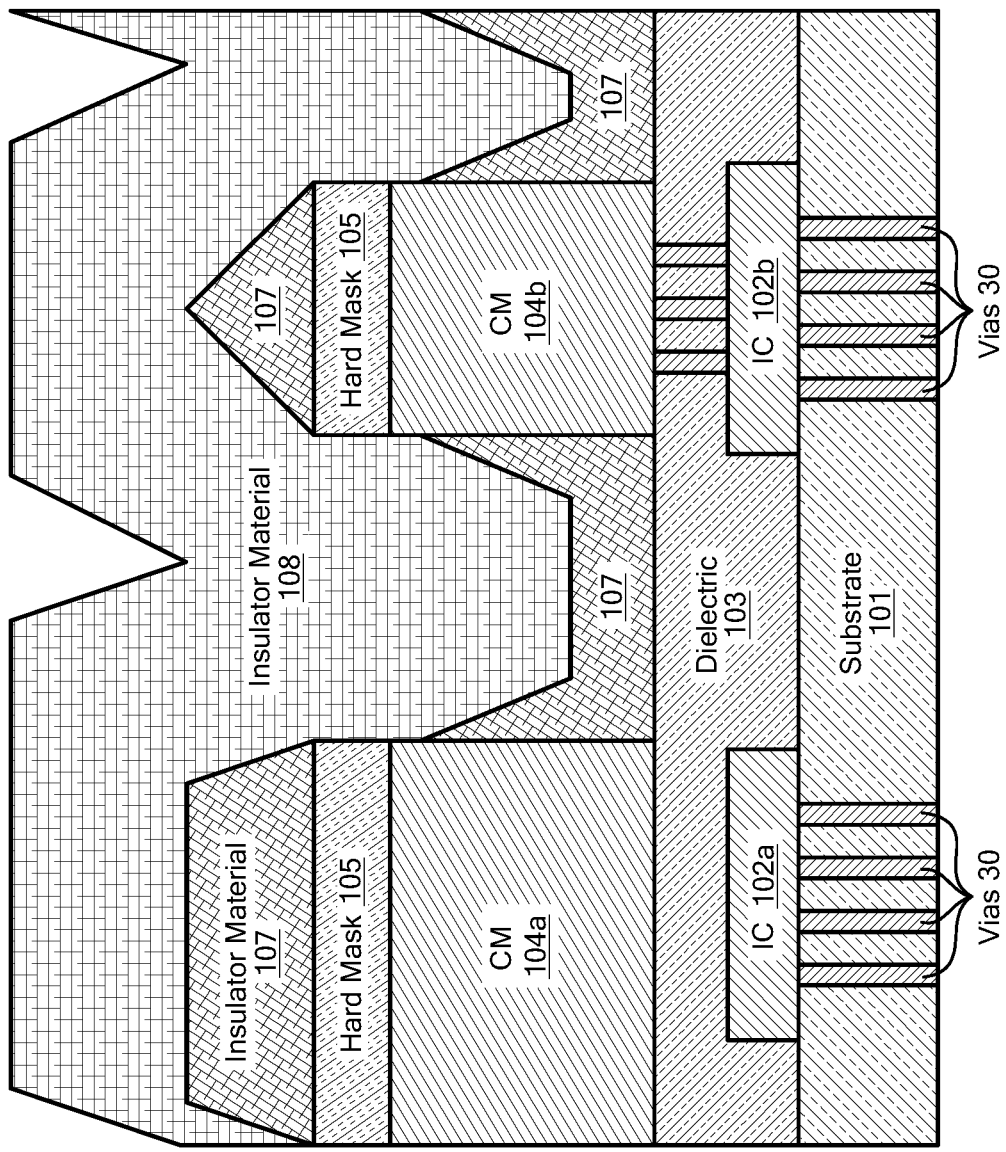

Referring to FIG. 1I, an insulator material 108 is deposited on the insulator material 107. In one example, the insulator material 108 is silicon dioxide.

Figure 1J:
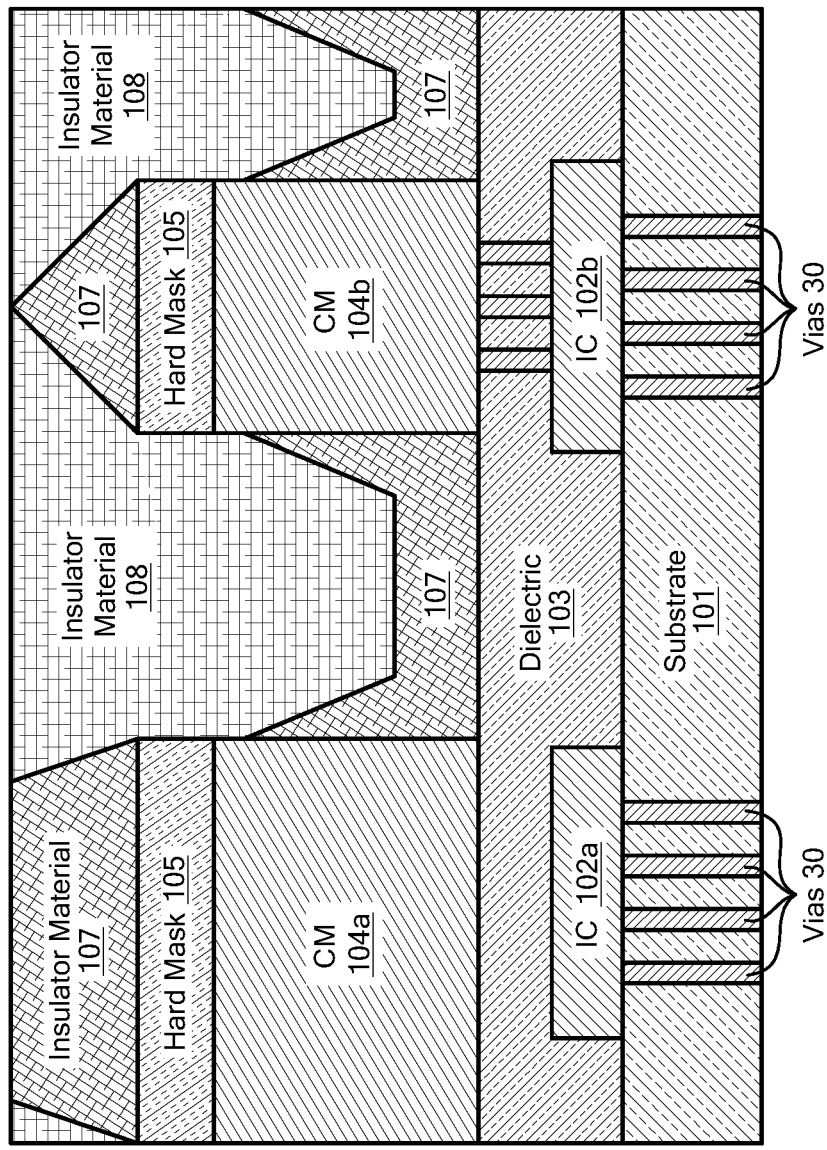

Referring to FIG. 1J, portions of the insulator material 108 are removed down to the insulator material 107. In some examples portions of the insulator material 107 may be removed. The remaining insulator material 107 and the remaining insulator material 108 are planarized together to form a planarized surface 111.

Figure 1K:
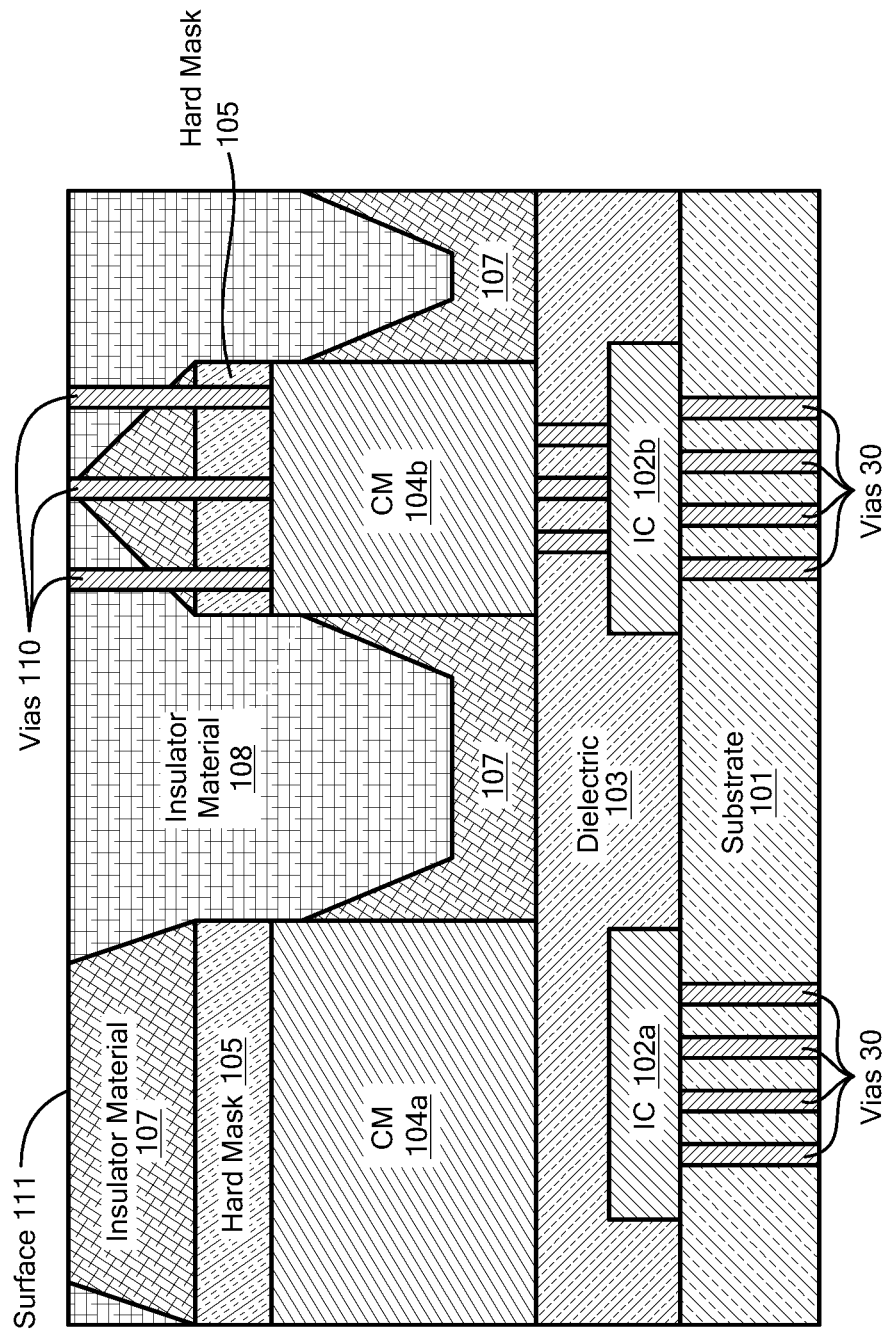

Referring to FIG. 1K, vias 110 are formed that extend from the surface 111 through the hard mask 105 down to and directly connected to the coil material 104b. In one example, the vias 110 include electroconductive material (e.g., tungsten, aluminum, copper and so forth).

Figure 1L:
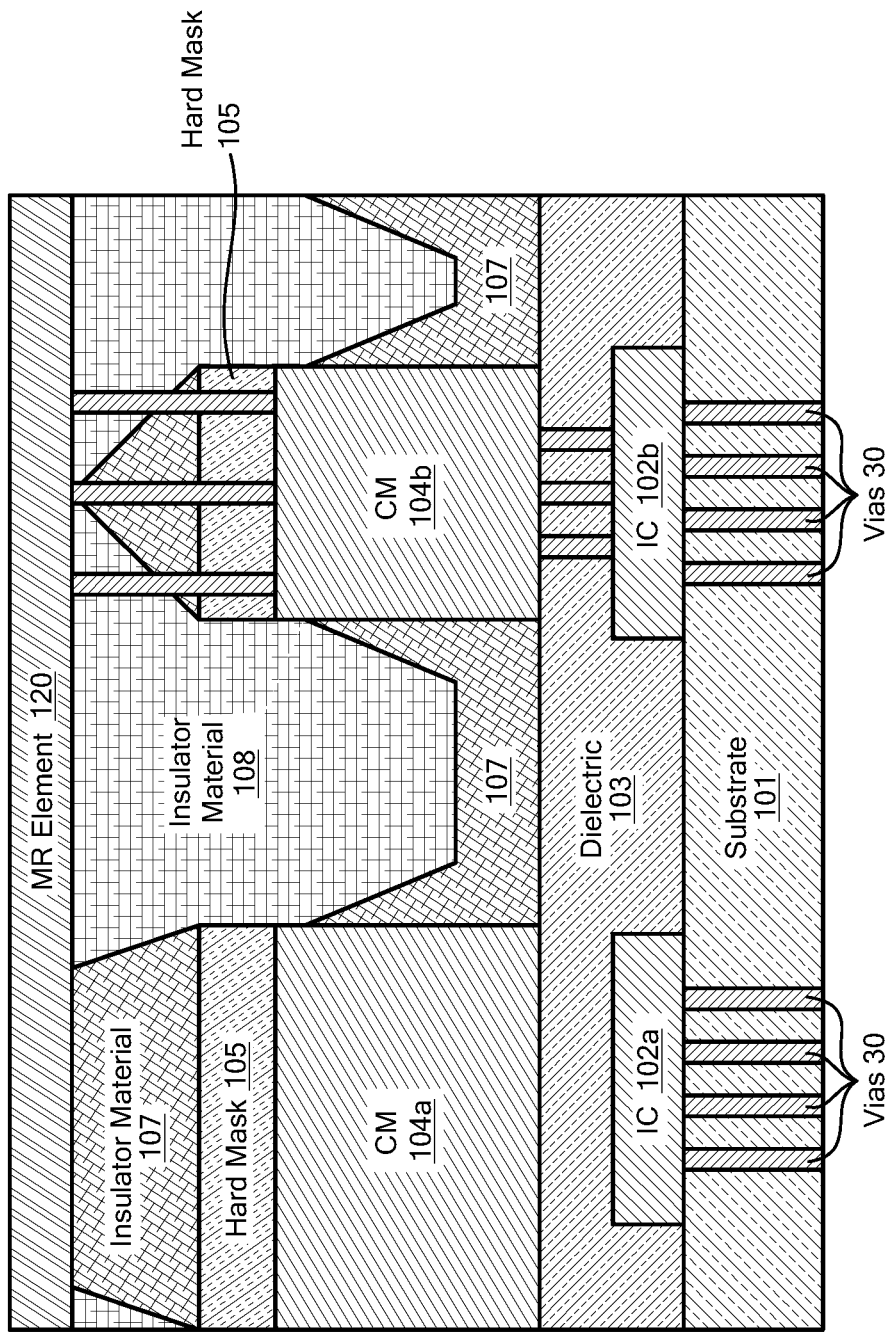

Referring to FIG. 1L, an MR element 120 is deposited on the vias 110 to form an electrical connection to the IC 102b. The MR element 120 may include at least one of a tunneling magnetoresistance (TMR) element, a magnetic tunnel junction (MTJ) element and/or a giant magnetoresistance (GMR) element. In one example, the MR element 120 is a multilayer magnetoresistance stack. In other examples, the MR element 120 may be a pillar of magnetoresistance elements.

Figure 1M:
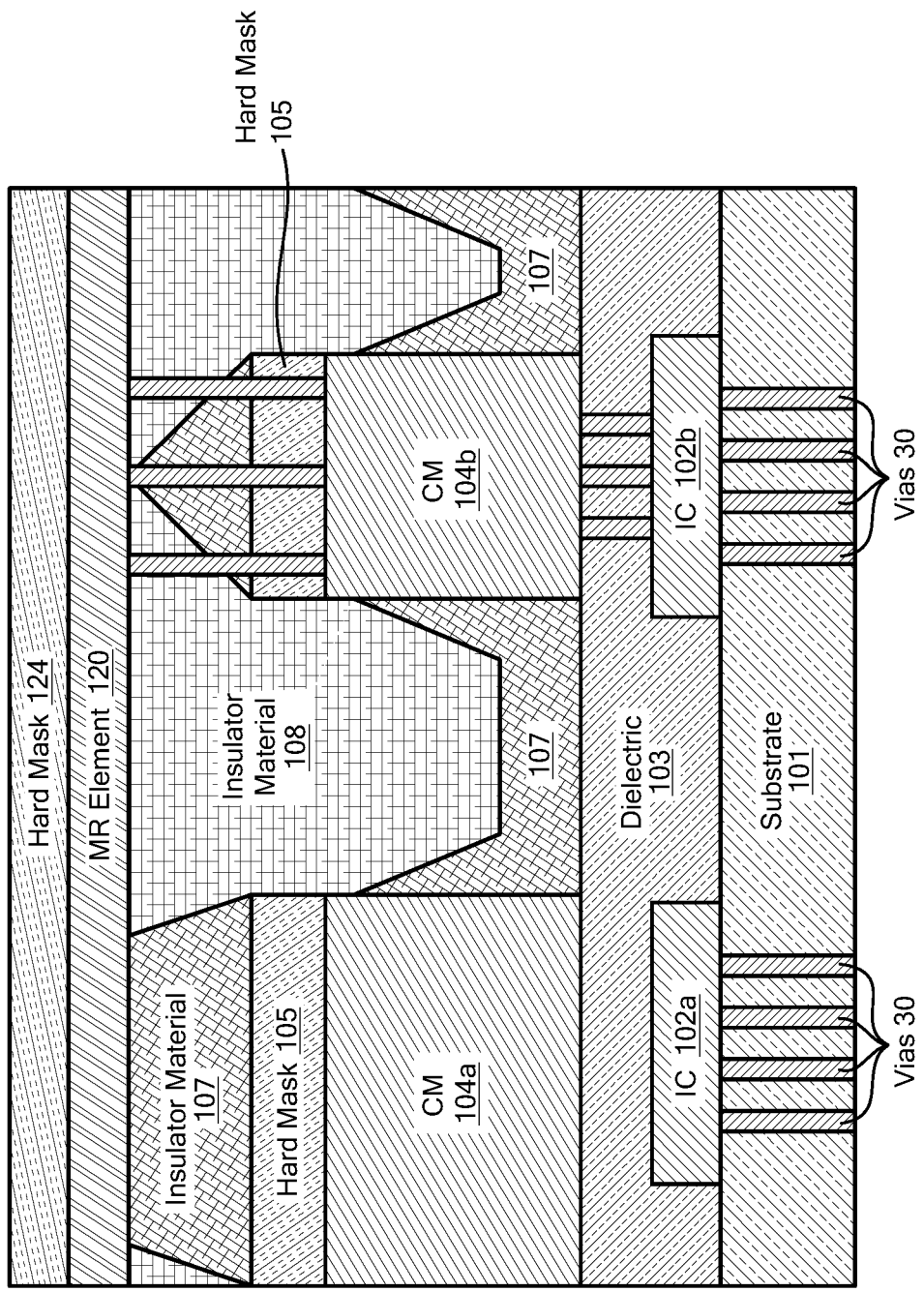

Referring to FIG. 1M, a hard mask 124 is deposited on the MR element 120. In one example, the hard mask 124 includes silicon dioxide.

Figure 1N:
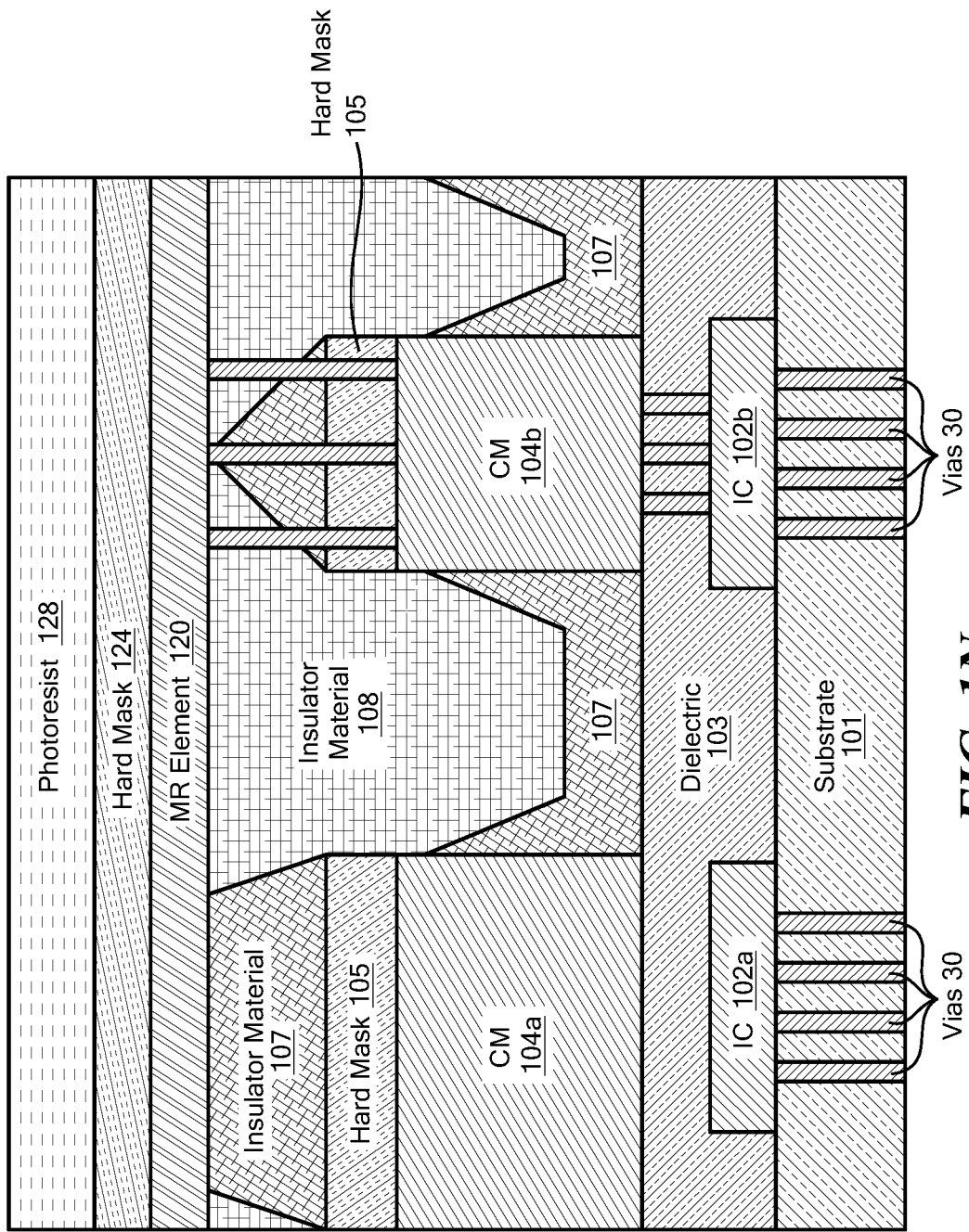
Figure 10:
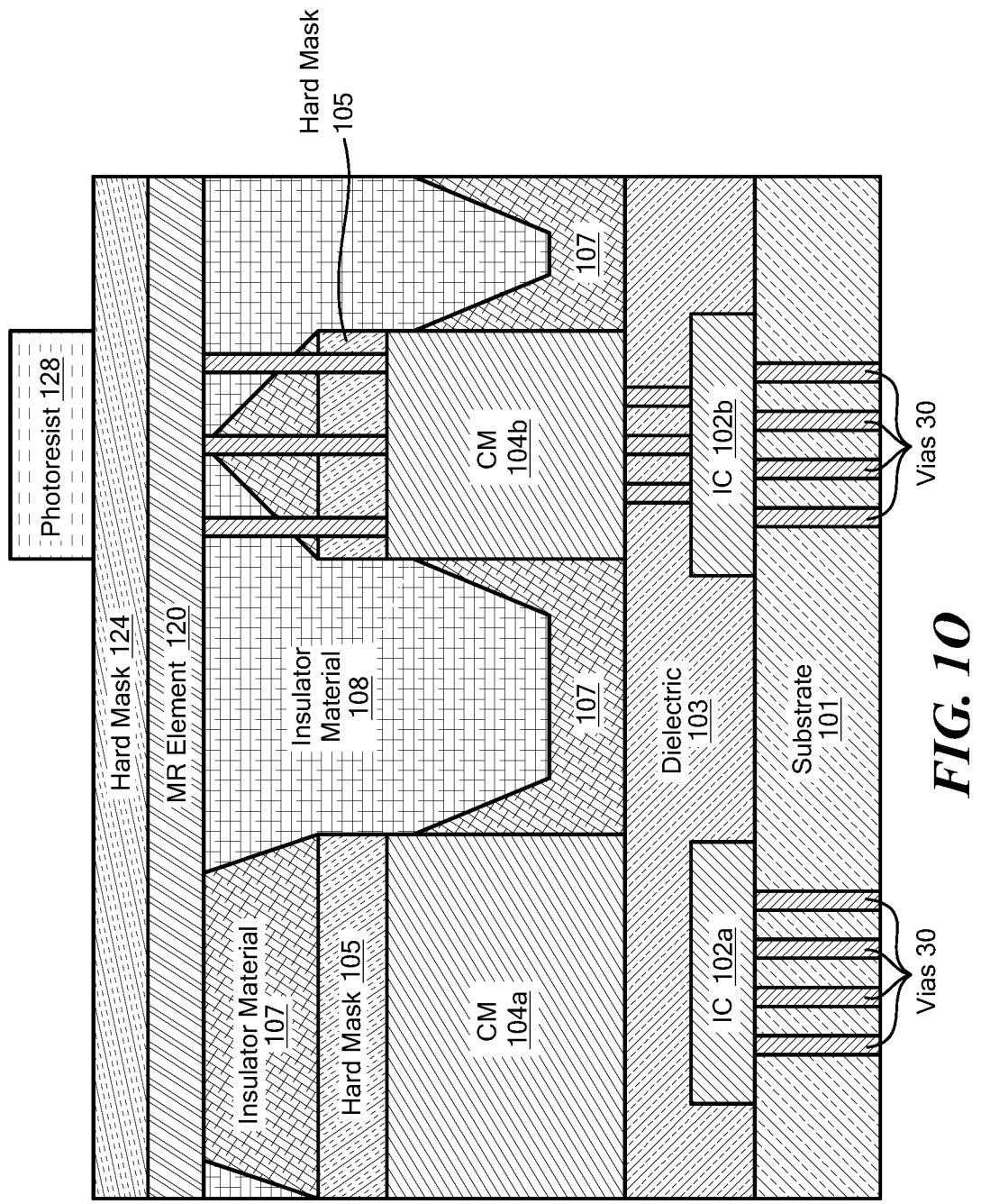

Referring to FIGS. 1N and 1O, a photoresist 128 is deposited on the hard mask 124. The photoresist is patterned using photolithography to expose regions of the hard mask 124 that will be removed to further define the MR 120 in subsequent processing. The remaining photoresist 128 protects the portions of the hard mask 124 that will not be removed and not exposed.

Figure 1P:
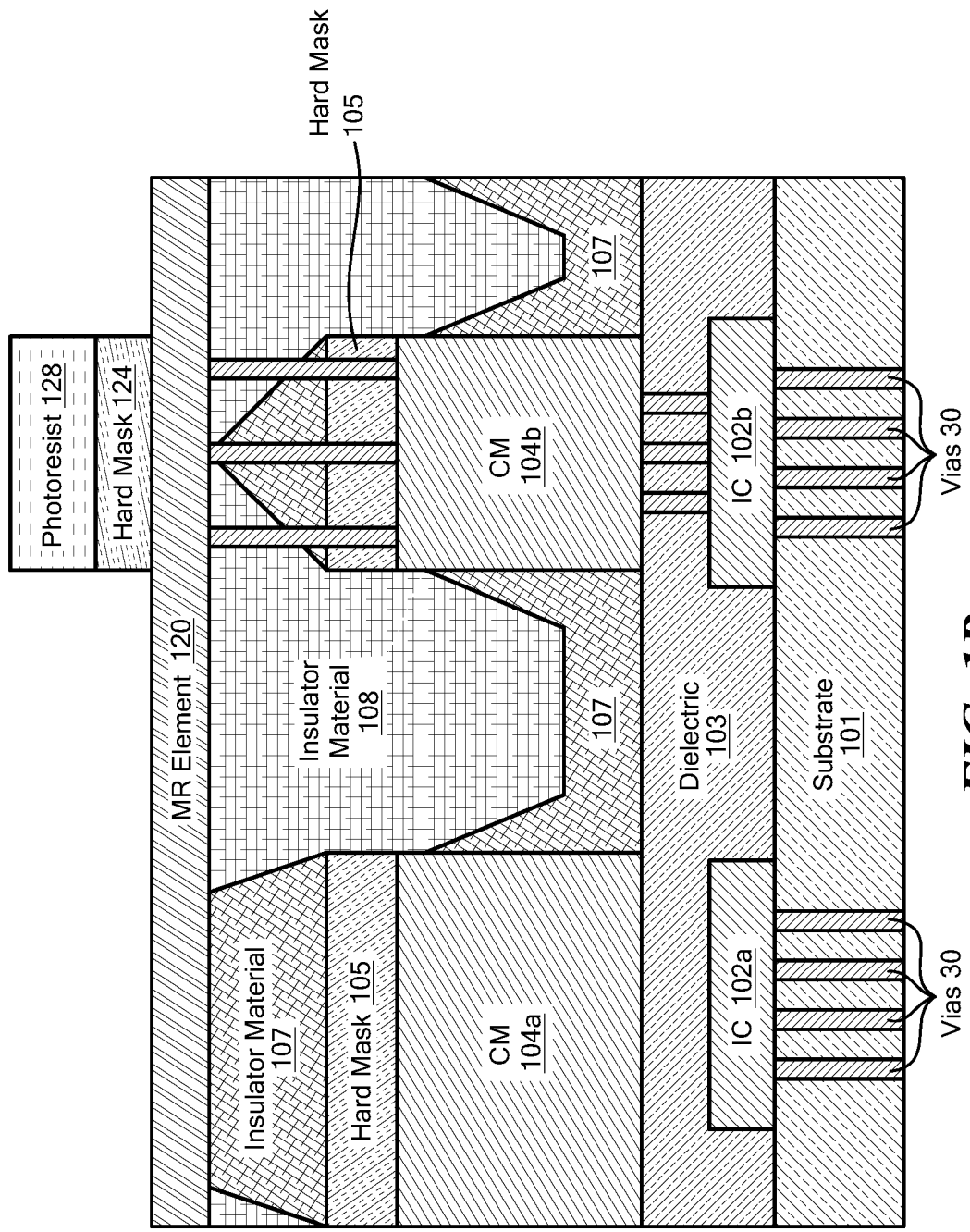

Referring to FIG. 1P, the exposed portions of the hard mask 124 not covered by the photoresist 128 are removed. The removal of the exposed portions of the hard mask 124 exposes portions of the MR element 120.

Figure 1Q:
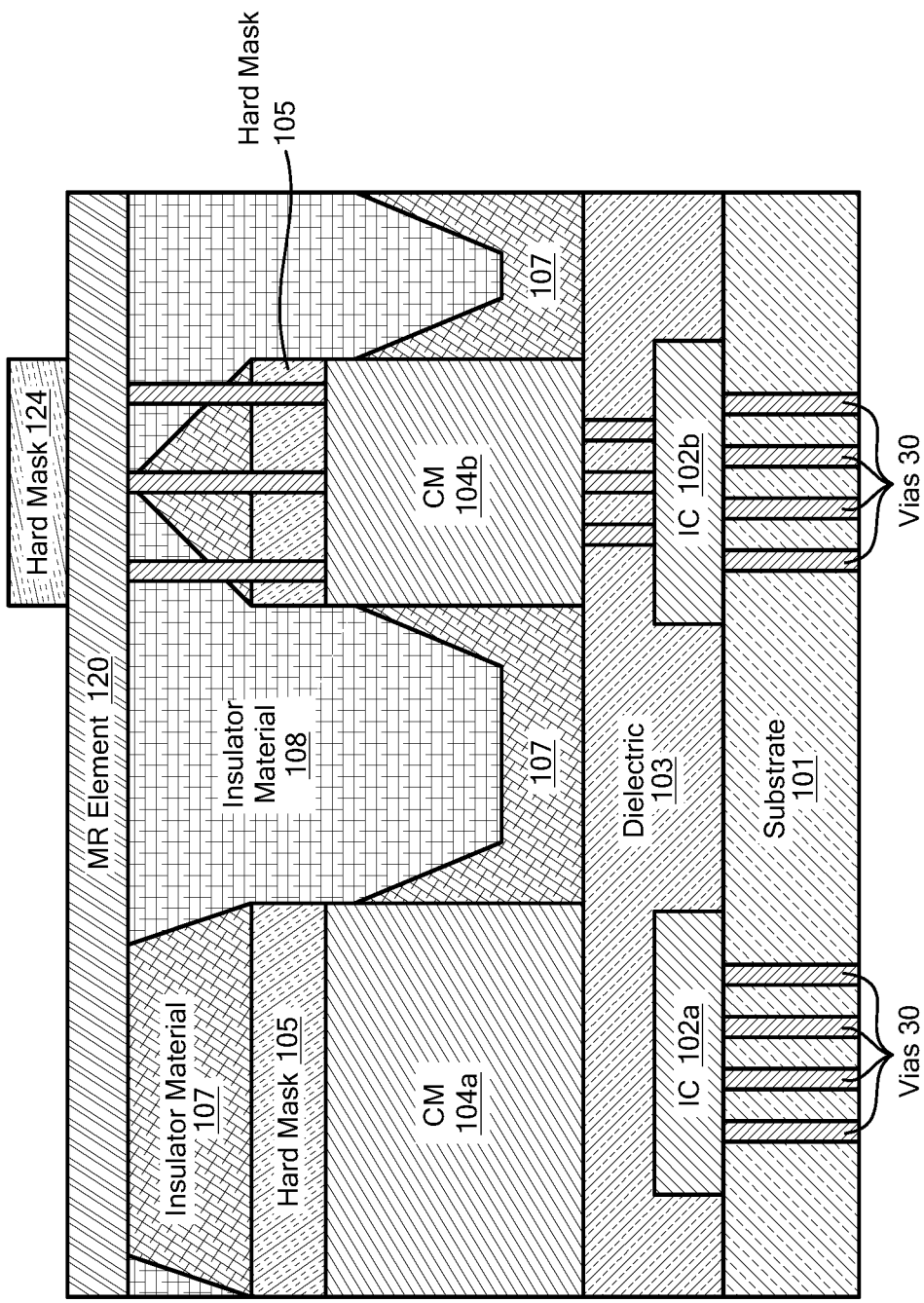
Figure 1R:
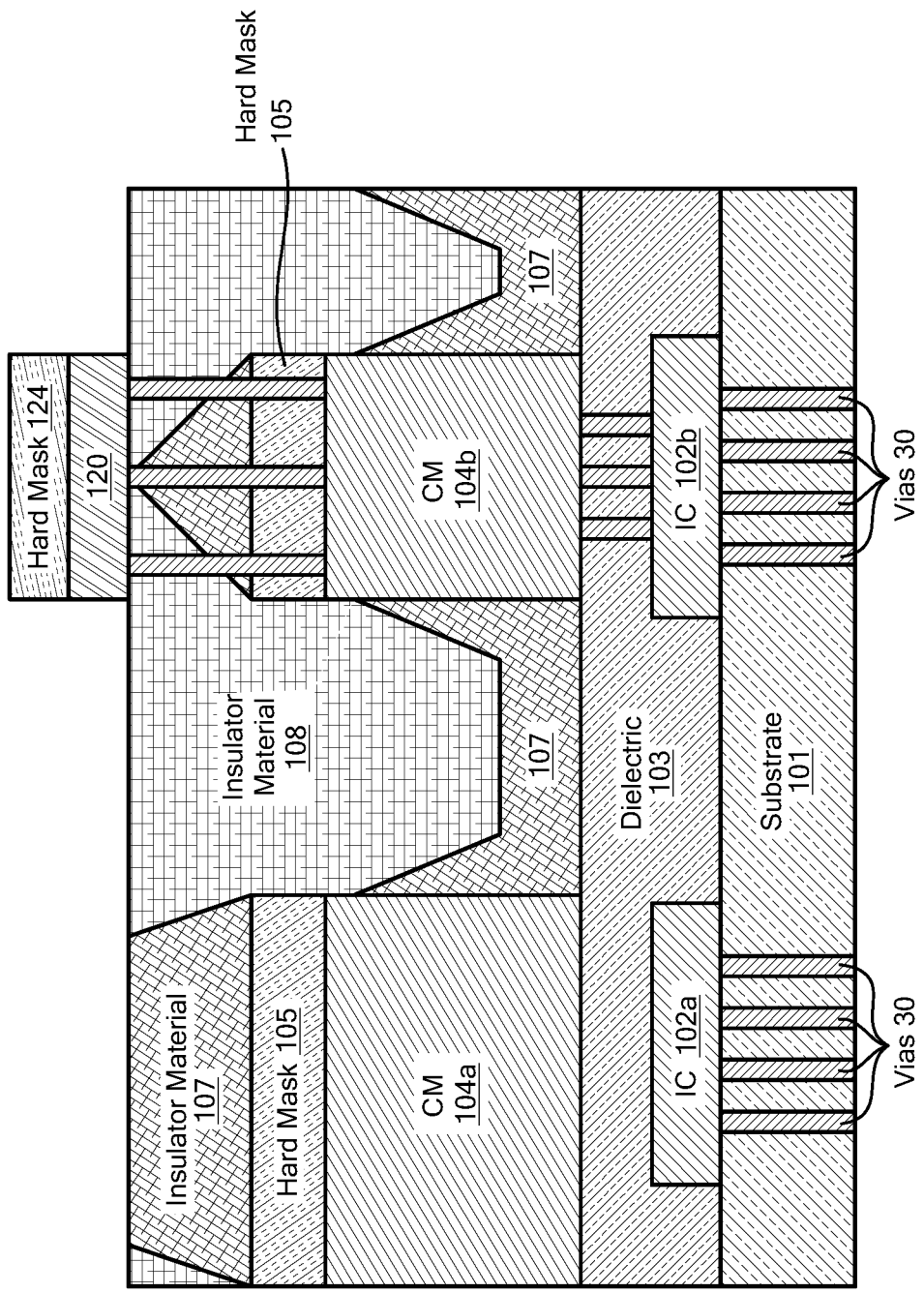

Referring to FIG. 1Q, the photoresist 128 is removed. Referring to FIG. 1R, the exposed portions of the MR element 120 are removed. In some examples, some but not all of the hard mask 124 may be also removed.

Figure 1S:
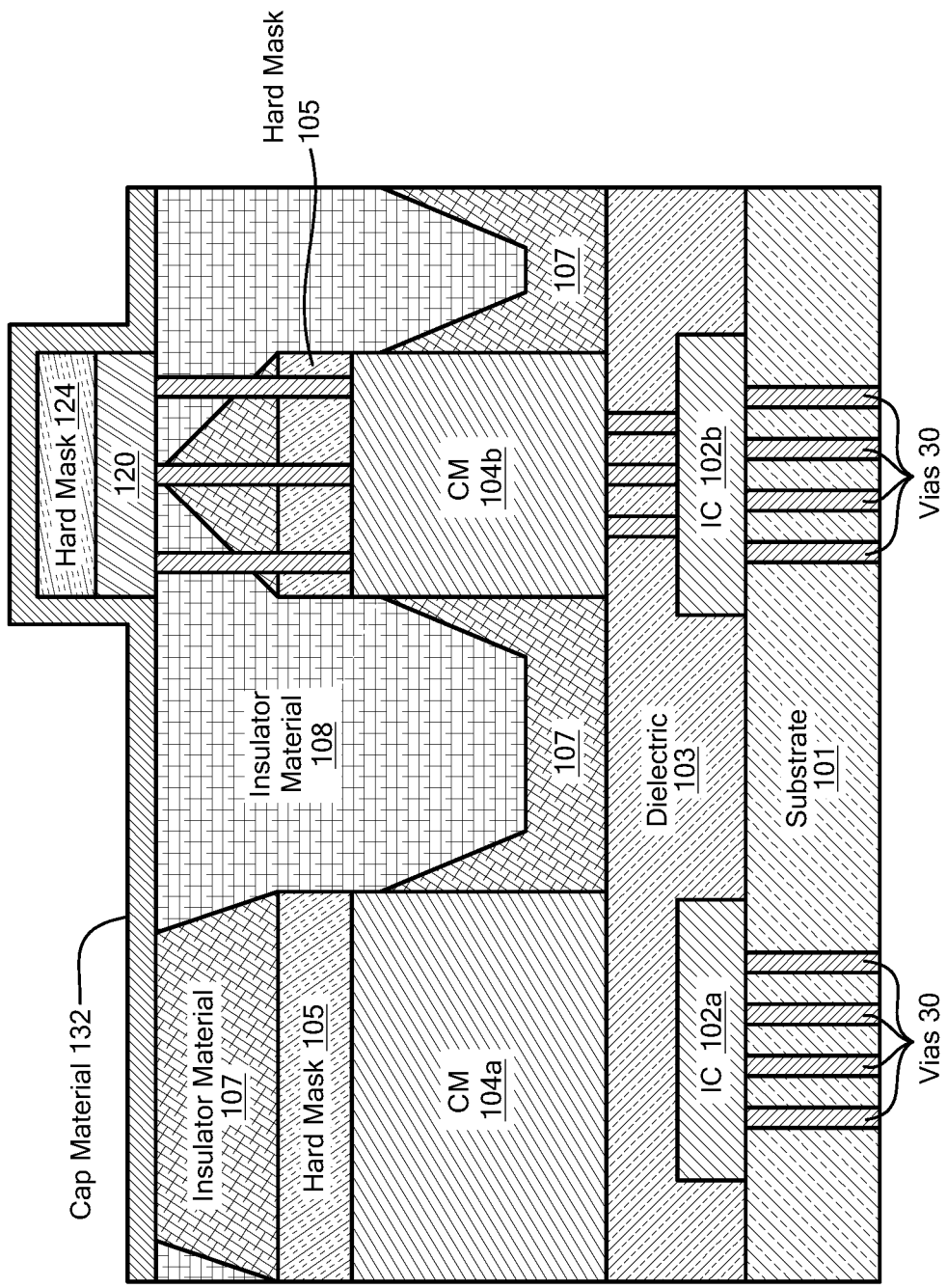

Referring to FIG. 1S, a capping material 132 is deposited on the hard mask 124, on the insulator material 107 and the insulator material 108 to protect the MR element 120. In one example, the capping material 132 is silicon nitride.

Figure 1T:
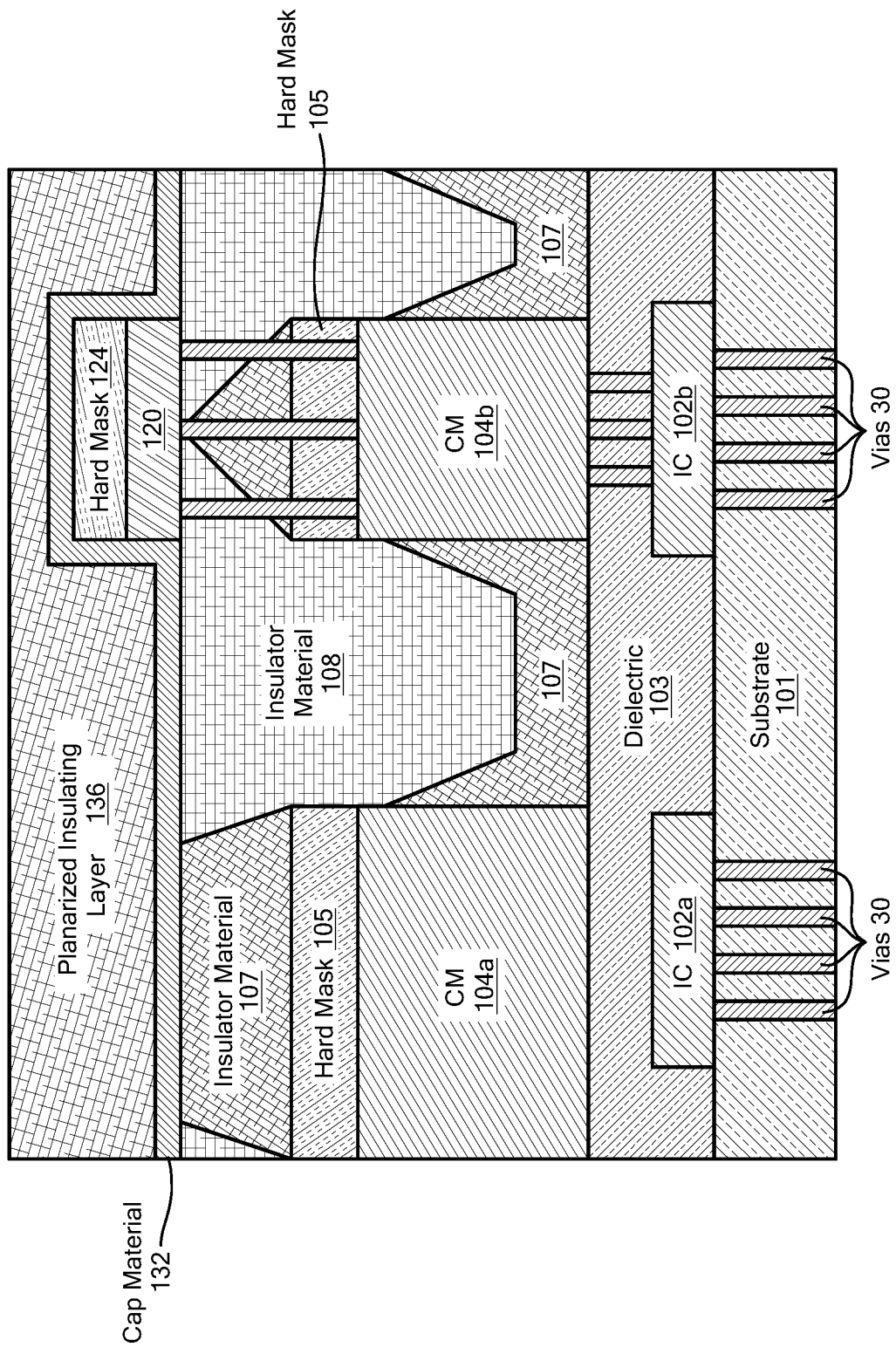

Referring to FIG. 1T, an insulator layer is deposited on the capping material 132 and planarize to form the planarized insulator layer 136. In one example, the planarized insulator layer 136 is silicon dioxide.

Figure 1U:
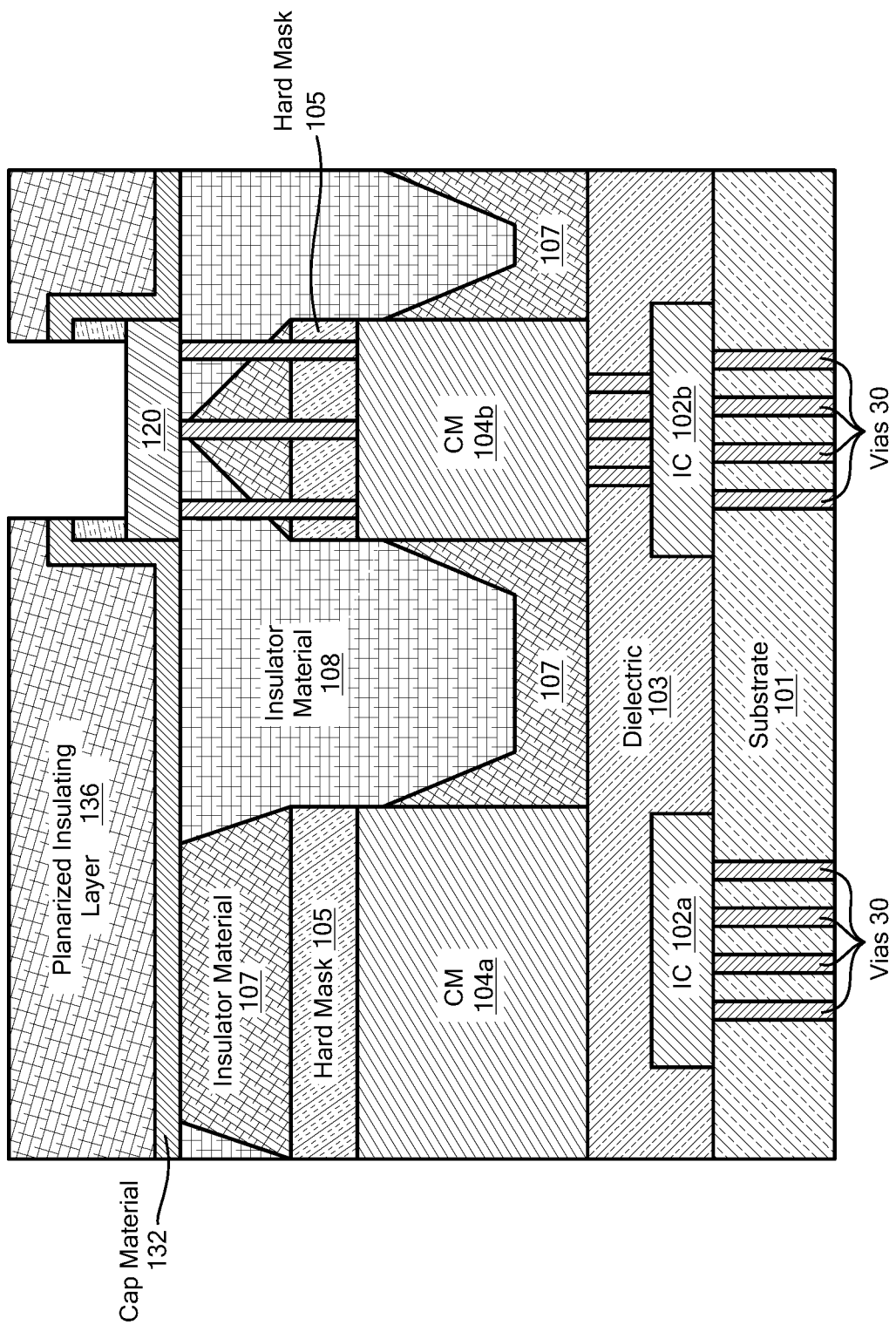
Figure 1V:
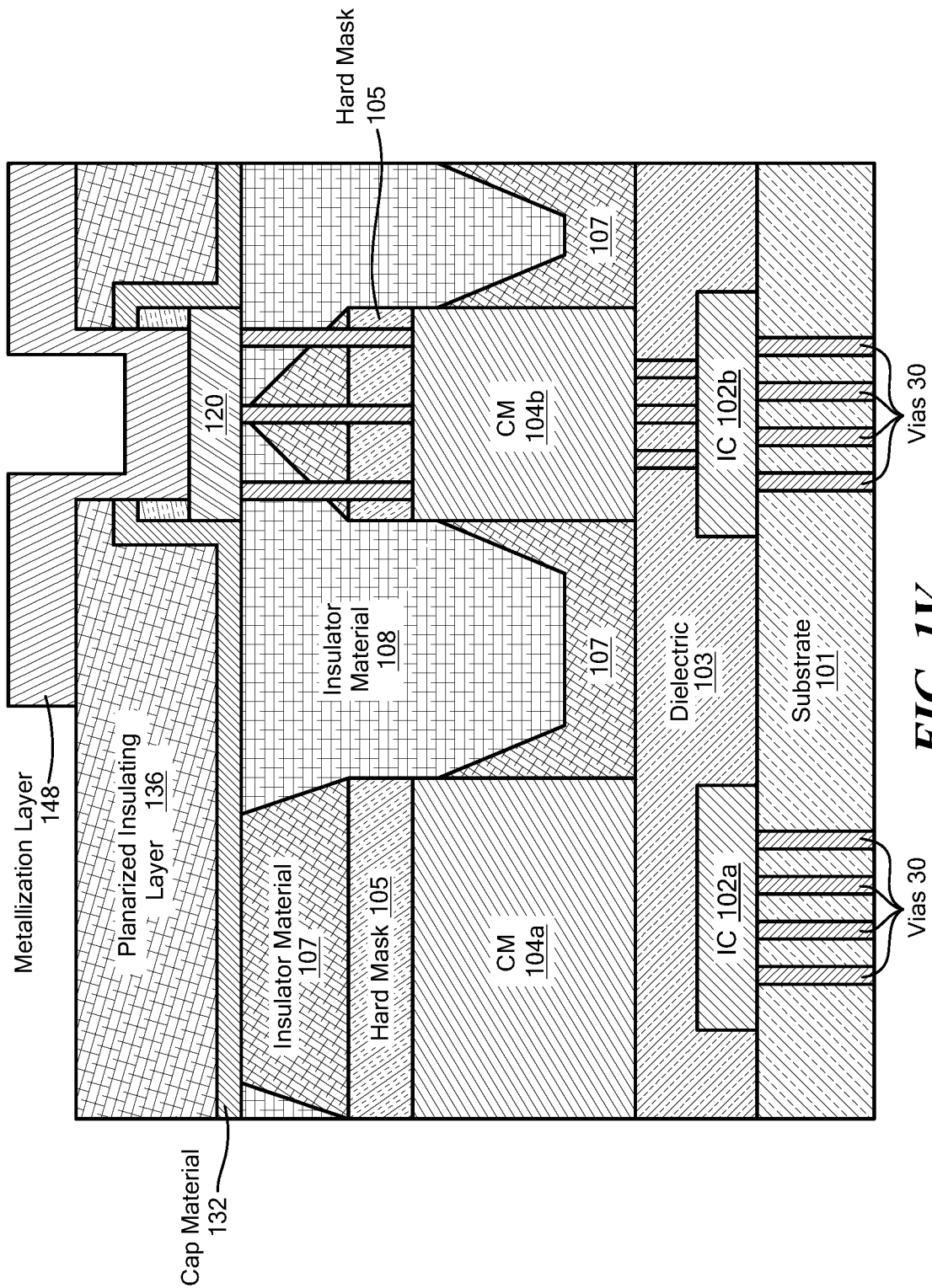

Referring to FIG. 1U, the planarized insulator layer 136, the capping material 132 and the hard mask 124 are etched down to the MR element 104. Referring to FIG. 1V, a metallization layer 148 is deposited on the MR element 120 and the planarized insulator layer 136. In one example, the metallization layer 148 is copper, aluminum and so forth.

Figure 1W:
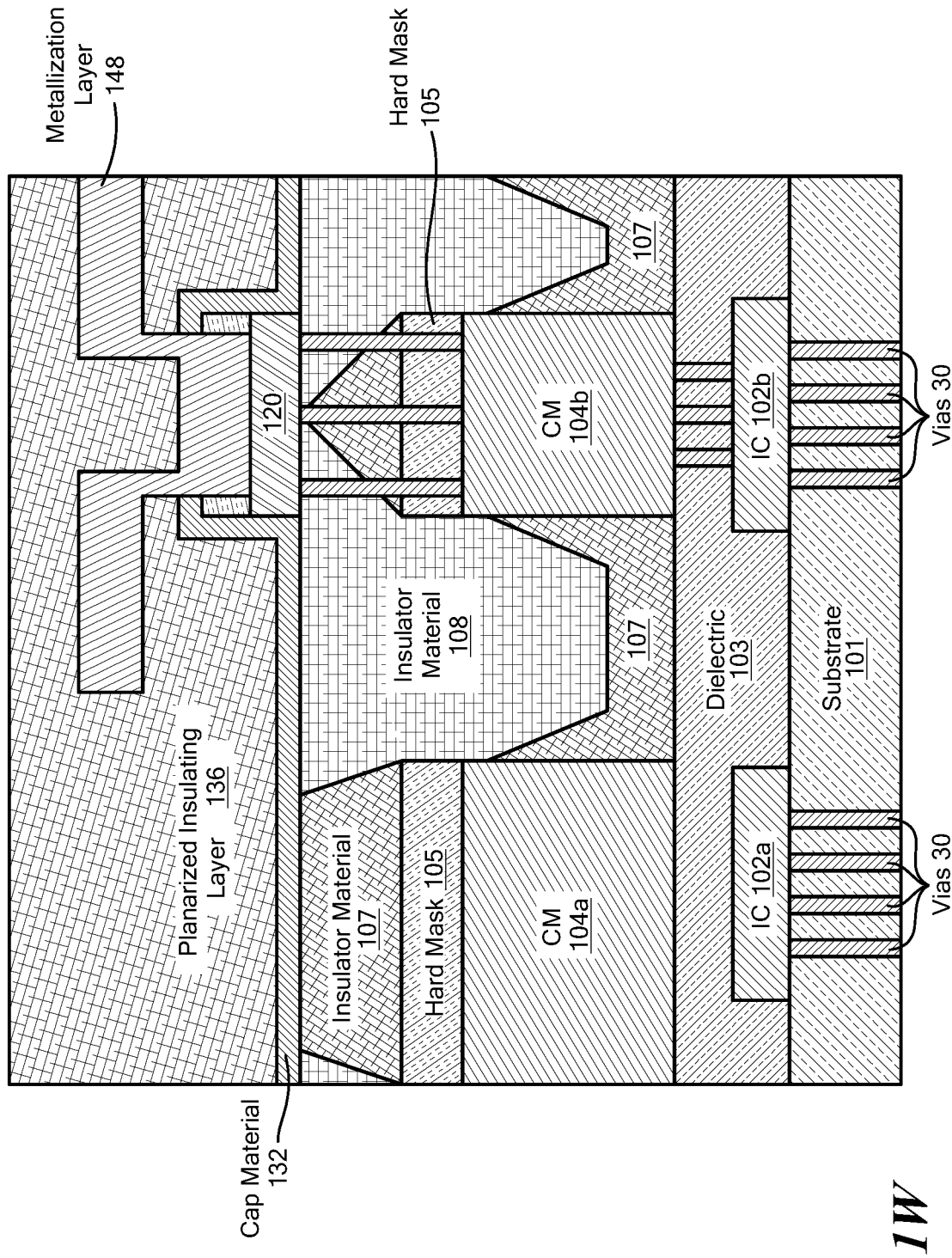

Referring to FIG. 1W, additional insulator material is deposited on the metallization layer 148 and the planarized insulator layer 136.

Figure 1X:
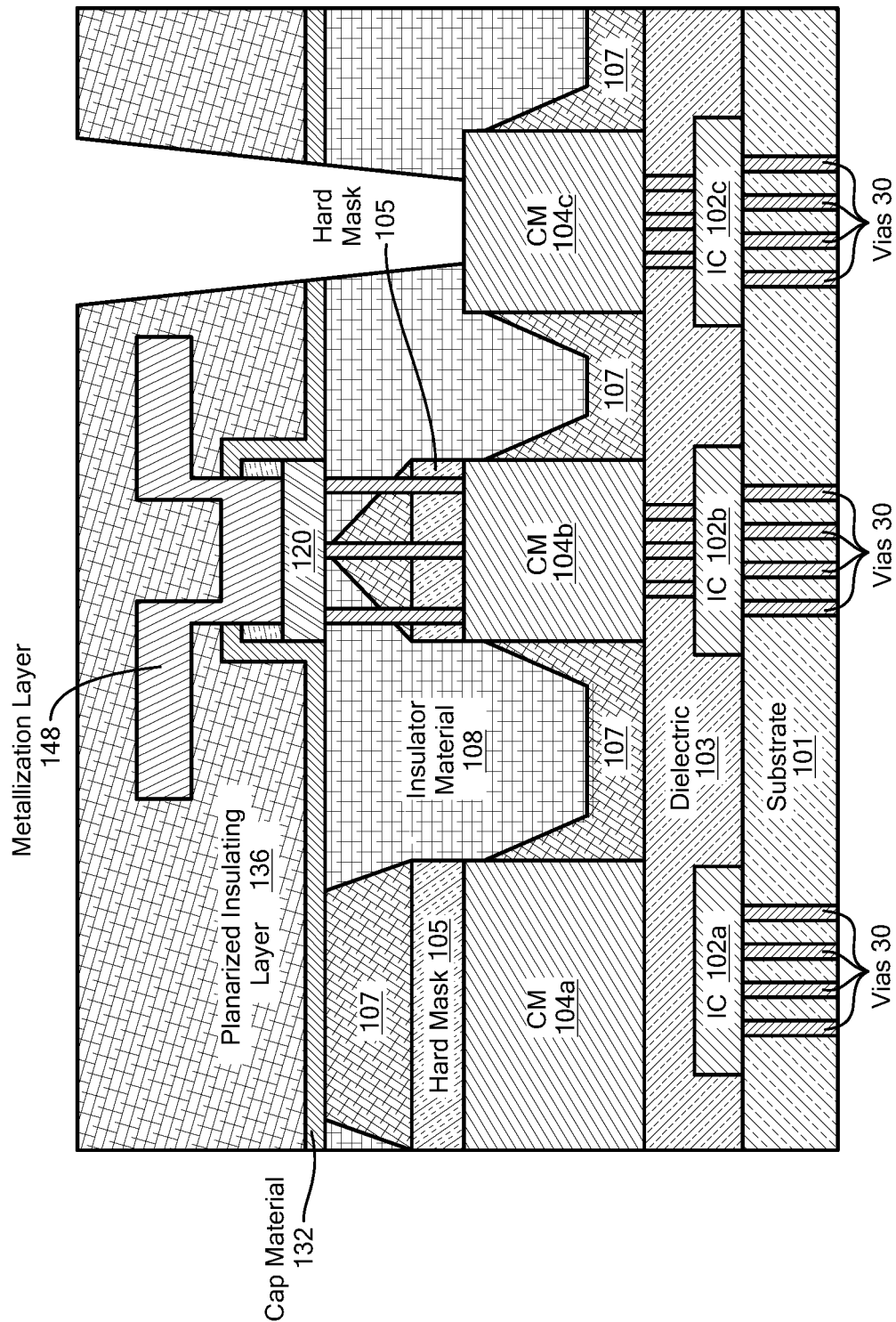

Referring to FIG. 1X, a coil may be added to be above the MR element 120. FIG. 1X depicts an additional portion of the coil material, coil material 104c, not shown in FIGS. 1A to 1W for simplicity. An etching process is performed to etch down to the coil material 104c. In some examples, coil material 104a and coil material 104c are part of the same coil. In other examples, coil material 104a and coil material 104c are part of separate and distinct coils.

Figure 1Y:
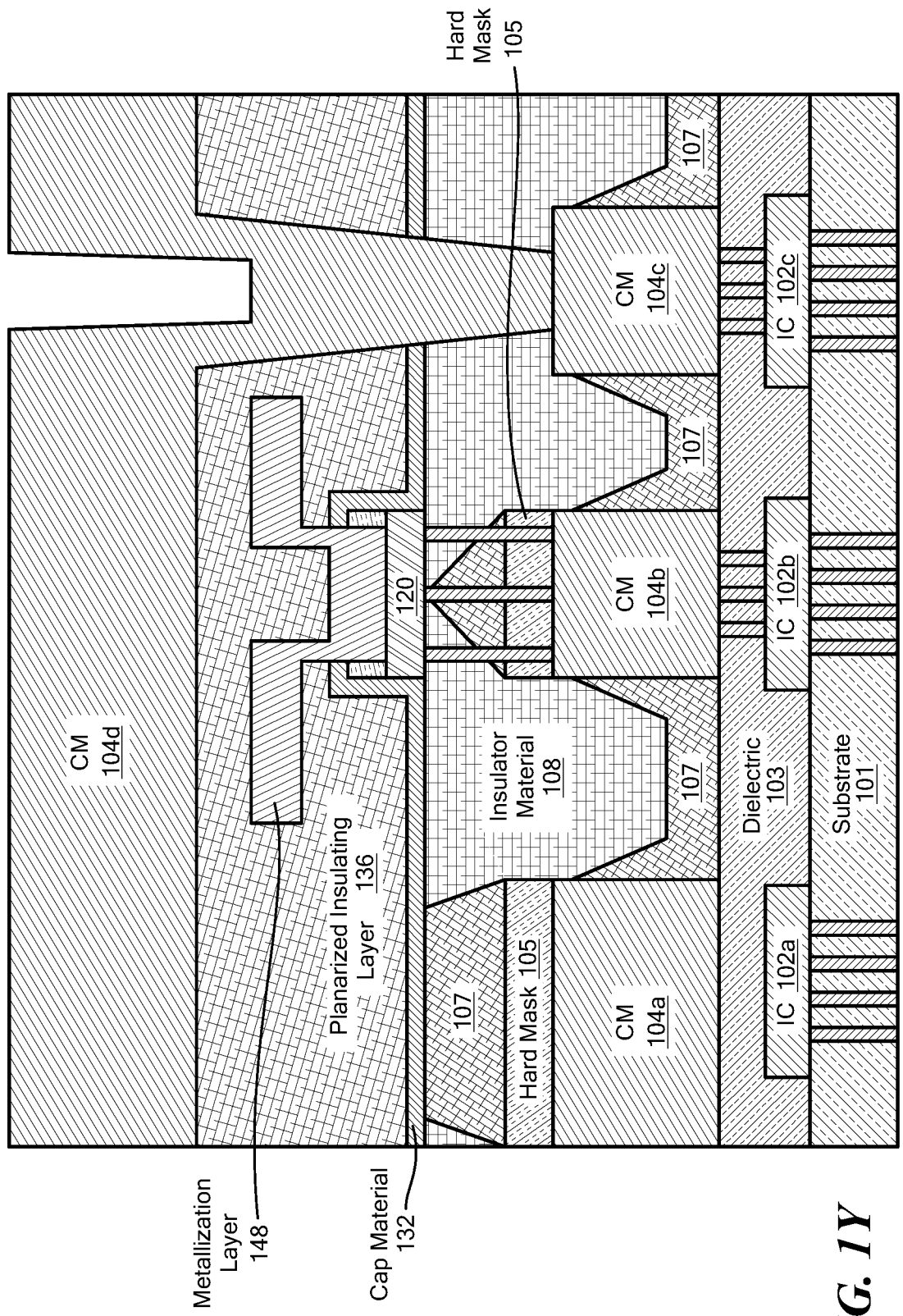
Figure 1Z:
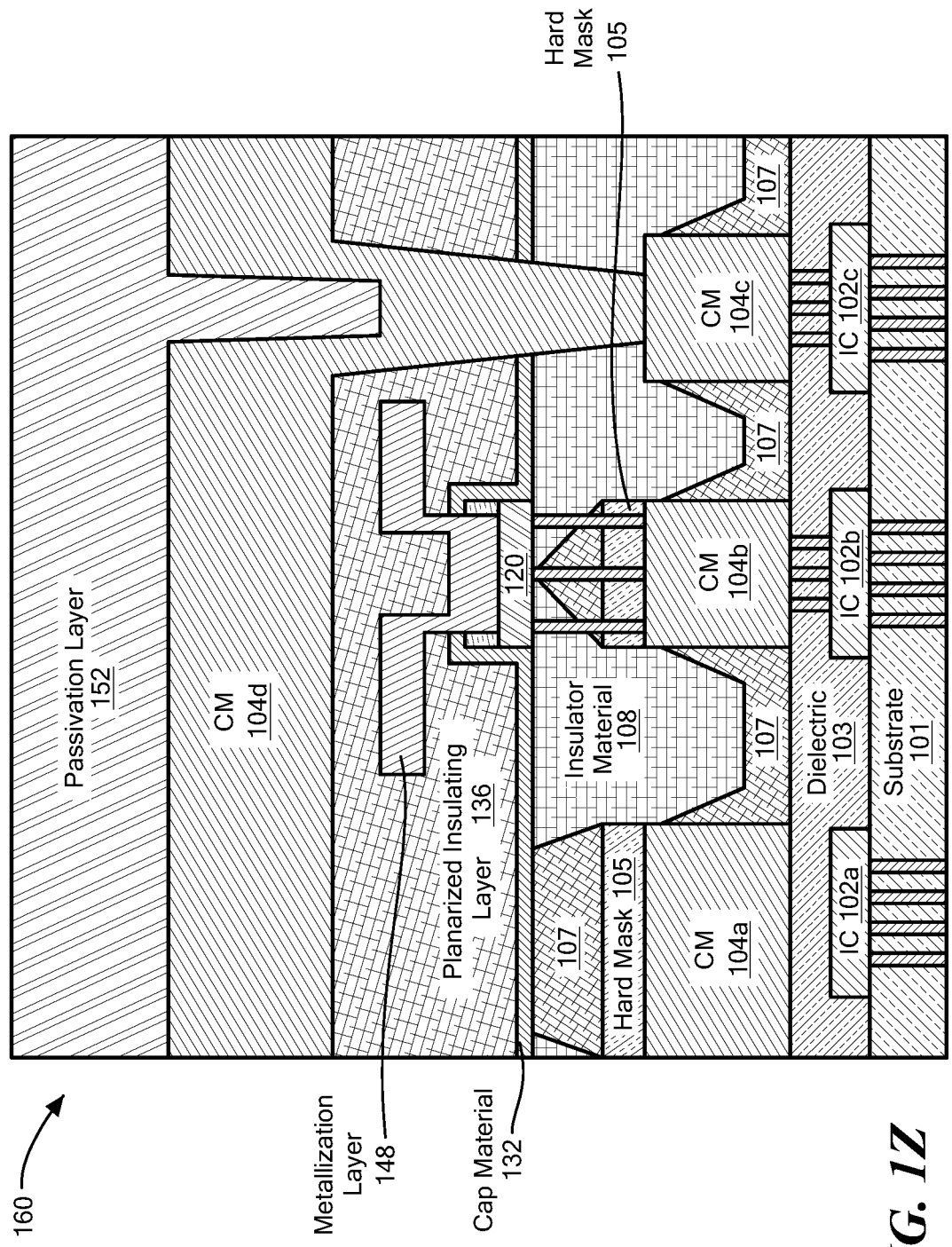

Referring to FIG. 1Y, additional coil material 104d is deposited on the exposed portion of the coil material 104c and on the insulator layer 136. Referring to FIG. 1Z, a passivation layer 152 is deposited on the coil material 104d to form a magnetic-field sensor 160.

Figure 2:
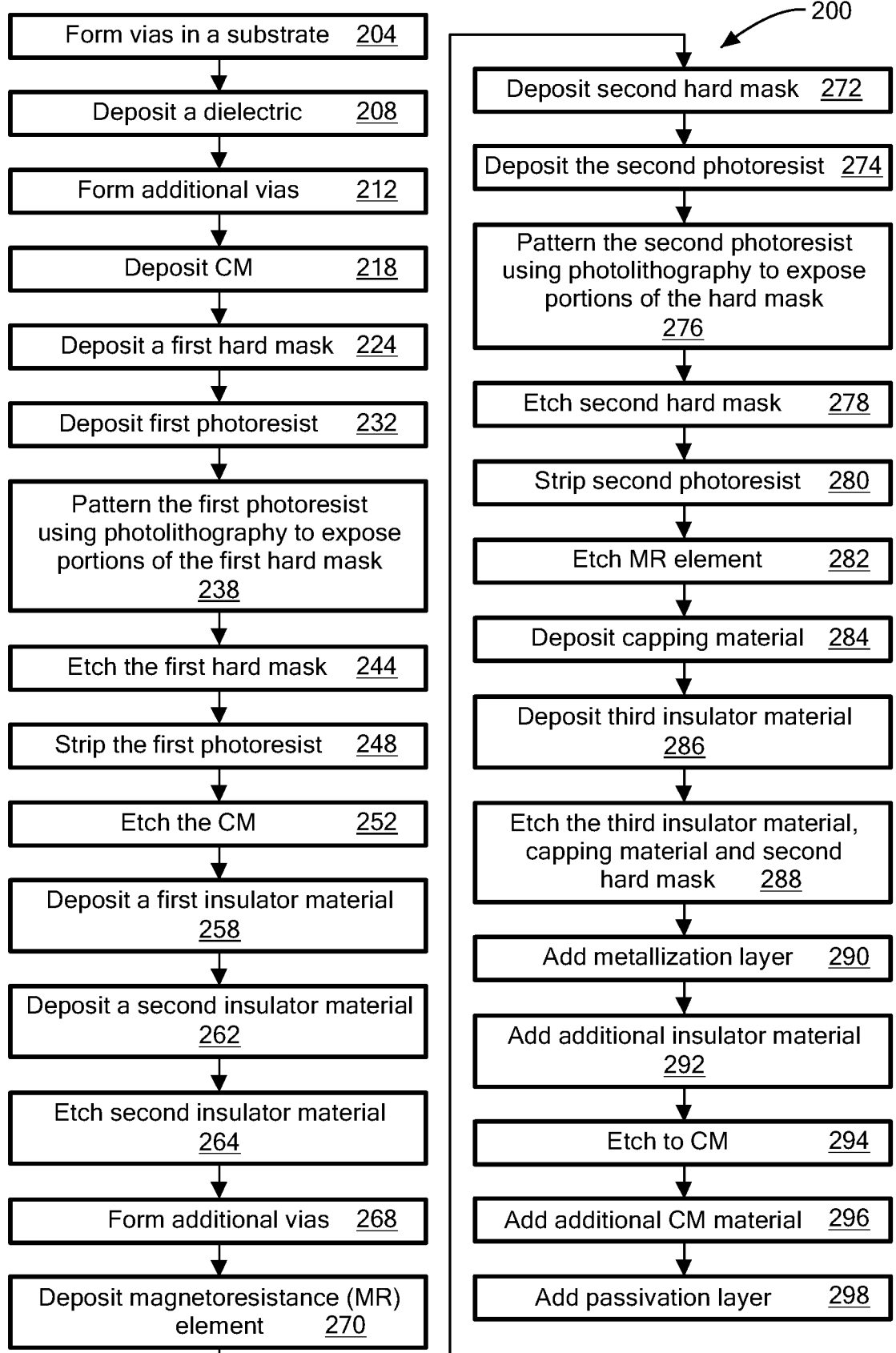
FIG. 2 is a flowchart of an example of a process to fabricate a coil above and below the MR element.

Referring to FIG. 2, an example of a process to fabricate the planarized coil in contact with the MR element is a process 200. The process 200 may be used to form the magnetic-field sensor 160 (FIG. 1Z).

Process 200 forms vias in a substrate (204). For example, the substrate 101 is etched to form ducts and an electroconductive material is deposited within the ducts to form the vias 30 that connect to the IC 102a, 102b, as depicted in FIG. 1A.

Process 200 deposits a dielectric (208). For example, a dielectric 103 (e.g., silicon dioxide) is deposited using chemical vapor deposition or physical vapor deposition, as depicted in FIG. 1A.

Process 200 forms additional vias (212). For example, the substrate 101 is etched to form ducts and an electroconductive material is deposited within the ducts to form the vias 32 that connect to the IC 102b, as depicted in FIG. 1A.

Process 200 deposits a coil (218). For example, a sputtering process is used to deposit an electroconductive material (e.g., titanium nitride, gold, aluminum, copper, platinum and so forth) on the dielectric 103, as depicted in FIG. 1B.

Process 200 deposits a first hard mask (224). For example, a hard mask 105 (e.g., silicon dioxide) is deposited using a standard deposition process on the coil material 104, as depicted in FIG. 1C.

Process 200 deposits first photoresist (232) and patterns the first photoresist using photolithography to expose portions of the first hard mask (238). For example, a photoresist 106 is deposited on the hard mask 105 and is patterned using standard photolithographic processes and exposing portions of the hard mask 105, as depicted in FIG. 1D.

Process 200 etches the first hard mask (244). For example, the exposed portions of the mask 105 are etched using a reactive ion etch process, which expose portions of the coil material 104, as depicted in FIG. 1E.

Process 200 strips the first photoresist (248). For example, the photoresist 106 is removed using a standard photoresist stripping process, as depicted in FIG. 1F.

Process 200 etches the coil (252). In one example, exposed portions of the coil material 104 is etched using a standard etching process that uses the hard mask 105 to mask portions of the coil material 104 to form the coil material 104a, 104a, as depicted in FIG. 1G.

Process 200 deposits a first insulator material (258). For example, the insulator material 107 (e.g., silicon dioxide) is deposited using a high-density plasma chemical vapor deposition (HDP-CVD) process for deep-gap filling that covers sides of the coil material 104a, 104b, the dielectric 103 and the hard mask 105, as depicted in FIG. 1H.

Process 200 deposits a second insulator material (262). For example, the insulator material 108 (e.g., silicon dioxide) is deposited using a standard deposition process that fills the gaps and covers the insulator material 107, as depicted in FIG. 1I.

Process 200 etches second insulator material (264). For example, a chemical mechanical polishing (CMP) process is used to polish the insulator material 108 to form the planarized surface 111, as depicted in FIG. 1J.

Process 200 forms additional vias (268). For example, the hard mask 105 is etched to form ducts and an electroconductive material is deposited within the ducts to form the vias 110 that connect to the coil material 104b, as depicted in FIG. 1K.

Process 200 deposits MR element (270). For example, the magnetoresistance element 120 is deposited using a standard deposition process on the planarized surface 111, as depicted in FIG. 1L.

Process 200 deposits the second hard mask (272). For example, a hard mask 124 (e.g., silicon dioxide) is deposited using a standard deposition process on the MR element 120, as depicted in FIG. 1M.

Process 200 deposits the second photoresist (274) and patterns the second photoresist using photolithography to expose portions of the second hard mask (276). For example, a photoresist 128 is deposited on the hard mask 124 and is patterned using standard photolithographic processes and exposing portions of the hard mask 124, as depicted in FIGS. 1N and 1O.

Process 200 etches the second hard mask (278). For example, the exposed portions of the mask 124 are etched using a reactive ion etch process, which expose portions of the MR element 120, as depicted in FIG. 1P.

Process 200 strips second photoresist (280). For example, the photoresist 128 is removed using a standard photoresist stripping process, as depicted in FIG. 1Q.

Process 200 etches MR element (282). For example, the magnetoresistance element 120 is deposited using a standard deposition process on the planarized surface 111, as depicted in FIG. 1L. For example, the exposed portions of the MR element 120 are etched away using an ion beam etching process, as depicted in FIG. 1R. An ion beam etch is used because the MR element 120 may include various different types of chemical elements and compounds that are not easily etched in a single chemistry.

Process 200 deposits capping material (284). For example, a capping material 132 (e.g., silicon nitride) is deposited using a standard deposition process on the insulator material 107, the insulator material 109, sidewalls of the MR element 120 and the hard mask 124 to protect the MR element 120 as depicted in FIG. 1S.

Process 200 deposits third insulator material (286). For example, the insulator material 136 (e.g., silicon dioxide) is deposited using a standard deposition process covers the cap material 132 and planarized using CMP, as depicted in FIG. 1T.

Process 200 etches the third insulator material, capping material and second hard mask (288). For example, the insulator material 136, the cap material 132 and the second hard mask 124 are etched using a standard dry etch process, as depicted in FIG. 1T.

Process 200 adds a metallization layer (290). For example, a metallization layer 148 (e.g., copper, aluminum and so forth) is sputtered on the MR element 120 and the planarized layer 136, as depicted in FIG. 1V.

Process 200 adds additional insulator material (292). For example, the insulator material 136 (e.g., silicon dioxide) is deposited on the existing insulator layer 136 using a standard deposition process that fills the gaps and covers the insulator material 107, as depicted in FIG. 1W.

Process 200 etches to the coil (294). In one example, a photolithographic process is used to expose a portion of the coil material 104c and a standard etching process is used, as depicted in FIG. 1X.

Process 200 adds additional coil material (296). For example, a sputtering process is used to deposit an electro-conductive material (e.g., titanium nitride, gold, aluminum, copper, platinum and so forth) on the insulator material 148 and the exposed coil material 104c, as depicted in FIG. 1Y.

Process 200 adds a passivation layer (298). A passivation layer (e.g., silicon dioxide and silicon nitride, and so forth) is deposited using standard deposition techniques, as depicted in FIG. 1Z.

Figure 3:
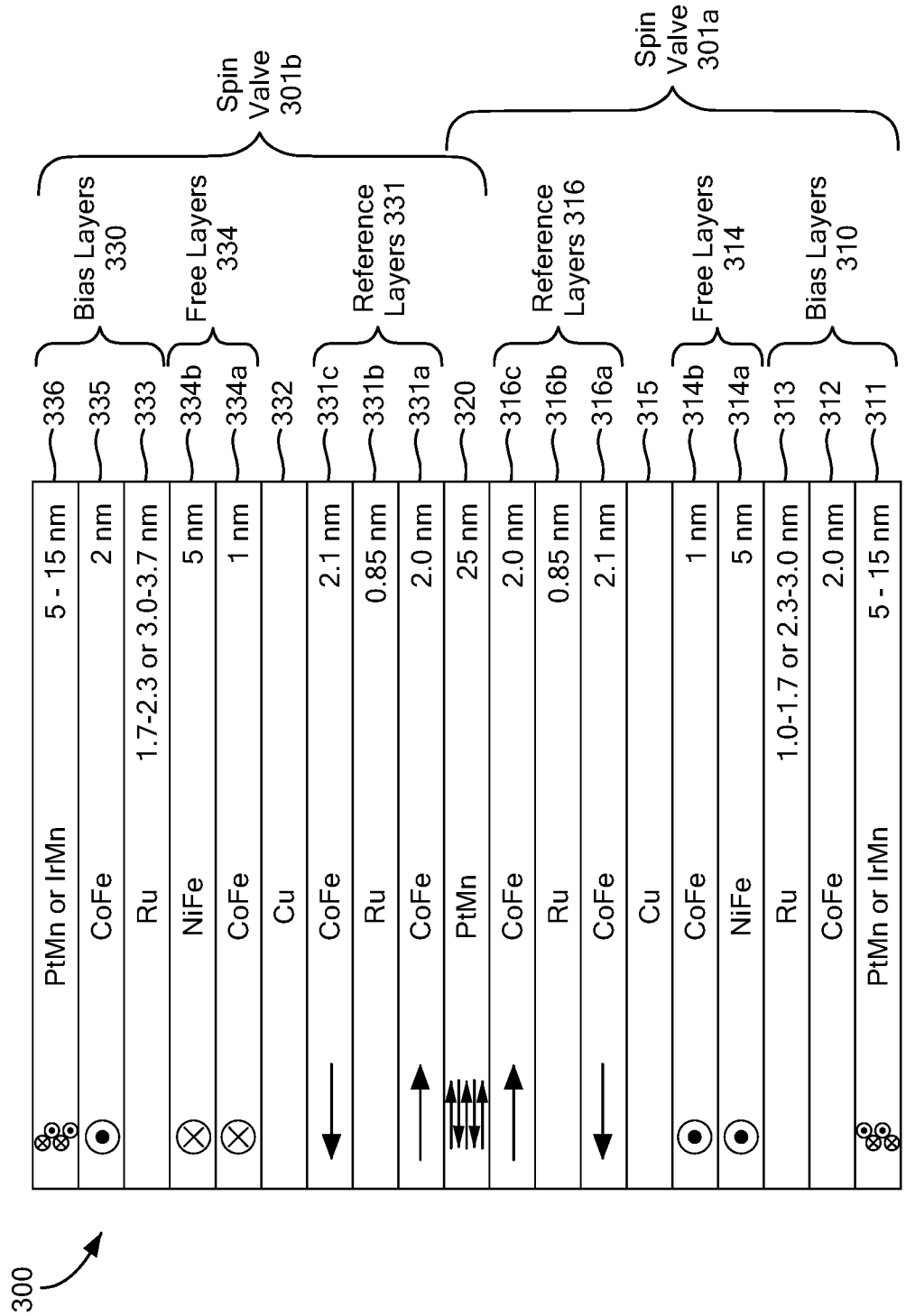
FIG. 3 is a diagram of an example of the MR element as a dual double-pinned spin valve element.

Referring now to FIG. 3, an example of the MR element 120 is an MR element 300. The MR element 300 is an example of a dual double-pinned spin valve element with pinned layers having magnetization in the same direction. The MR element 300 includes a plurality of layers. The plurality of layers includes a first spin valve 301a disposed over the nonmagnetic seed layer 302 and a second spin valve 301b disposed over the first spin valve 301a. The plurality of layers also includes an antiferromagnetic pinning layer 320, which is shared by the first spin valve 301a and the second spin valve 301b.

The first spin valve 301a includes bias layers 310, free layer 314 and reference layers 316. The bias layers 310 includes an antiferromagnetic pinning layer 311 and a ferromagnetic pinned layer 312 disposed over the antiferromagnetic pinning layer 311. The first spin valve 301a also includes a nonmagnetic spacer layer 313 disposed over the ferromagnetic pinned layer 312 with the free layers 314 structure 314 disposed over the nonmagnetic spacer layer 313. The free layers 314 includes a first ferromagnetic free layer 314a and a second ferromagnetic free layer 314b disposed over the first ferromagnetic free layer 314a.

The first spin valve 301a further includes a nonmagnetic spacer layer 315 disposed over the free layers 314 with the reference layers 316 disposed over the nonmagnetic spacer layer 315. The reference layers 316 includes a ferromagnetic layer 316a, a ferromagnetic pinned layer 316c and a nonmagnetic spacer layer 316b disposed therebetween.

The second spin valve 301b, which is similar to the first spin valve 301a, but includes layers that are in a substantially reverse order or arrangement as the layers which are shown in the first spin valve 301a with respect to the seed layer 302, includes reference layers 331 disposed over the antiferromagnetic pinning layer 320, a nonmagnetic spacer layer 332 disposed over the reference layers 331 and free layers 333 disposed over the nonmagnetic spacer layer 332. The reference layers 331 includes a first ferromagnetic layer 331a, a second ferromagnetic pinned layer 331c and a nonmagnetic spacer layer 331b disposed therebetween. Additionally, the free layers 334 includes a first ferromagnetic free layer 334a and a second ferromagnetic free layer 334b disposed over the first ferromagnetic free layer 334a.

The second spin valve 301b also includes bias layers 330. The bias layer 330 includes nonmagnetic spacer layer 333 disposed over the free layers 334, a ferromagnetic pinned layer 335 disposed over the nonmagnetic spacer layer 333 and an antiferromagnetic pinning layer 336 disposed over the ferromagnetic pinned layer 335.

Each of the layers in prior art MR element 300 includes one or more respective materials (e.g., magnetic materials) and has a respective thickness, as shown. Materials of the layers are shown by atomic symbols. Additionally, thicknesses of the layers are shown in nanometers. In other embodiments, the material and thicknesses of the layers in MR element 300 may be replaced with other materials and thicknesses.

Arrows are shown that are indicative of magnetization directions of the layers. Arrows coming out of the page are indicated as dots within circles and arrows going into the page are indicated as crosses within circles.

The processes described herein are not limited to the specific examples described. For example, the process 200 is not limited to the specific processing order of FIG. 2. Rather, any of the processing blocks of FIG. 2 may be re-ordered, combined, or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   forming a metal layer on a substrate, wherein the metal layer comprises a first coil;
   forming a planarized insulator layer on the metal layer,
   forming at least one via in the planarized insulator layer;
   depositing a magnetoresistance (MR) element on the planarized insulator layer, wherein the at least one via electrically connects to the metal layer on one end and to MR element on the other end; and
   forming a second coil extending above the MR element.

2. The method of claim 1, wherein the first coil and the second coil are the same coil.

3. The method of claim 1, further comprising depositing a hard mask directly on the metal layer,
   wherein forming the at least one via in the planarized insulator layer comprises forming the at least one via in the planarized insulator layer and in the hard mask.

4. The method of claim 3, wherein depositing the hard mask comprises depositing a hard mask comprising silicon dioxide.

5. The method of claim 1, further comprising depositing insulator material directly on the metal layer.

6. The method of claim 5, wherein depositing the insulator material directly on the metal layer comprises using high-density plasma chemical vapor deposition (HDP-CVD).

7. The method of claim 5, wherein forming a planarized insulator layer on the metal layer comprises forming a planarized insulator layer on the coil on the insulator material.

8. The method of claim 1, wherein depositing the MR element comprises depositing at least one of a tunneling magnetoresistance (TMR), a magnetic tunnel junction (MTJ) and/or a giant magnetoresistance (GMR).

9. The method of claim 1, wherein depositing the MR element comprises depositing an MR stack or MR pillar.

10. The method of claim 1, further comprising depositing a hard mask directly on to the MR element.

11. The method of claim 1, wherein the substrate is a dielectric, and further comprising:
    covering an integrated circuit (IC) with the dielectric;
    forming at least one via in the dielectric,
    wherein the at least one via in the dielectric electrically connects the metal layer to the IC.

12. A magnetic field sensor, comprising:
    a substrate;
    a metal layer on the substrate and comprising a first coil;
    a planarized insulator layer on the metal layer;
    a magnetoresistance (MR) element on the planarized insulator layer;
    at least one via in the planarized insulator layer that electrically connects to the metal layer on one end and to the MR element at the other end; and
    a second coil extending above the MR element.

13. The magnetic field sensor of claim 12, wherein the first coil and the second coil are the same coil.

14. The magnetic field sensor of claim 12, further comprising a hard mask directly on the metal layer,
    wherein the at least one via is in the planarized insulator layer and in the hard mask.

15. The magnetic field sensor of claim 14, the hard mask comprises silicon dioxide.

16. The magnetic field sensor of claim 12, further comprising an insulator material located directly on the metal layer.

17. The magnetic field sensor of claim 12, wherein the MR element comprises at least one of a tunneling magnetoresistance (TMR), a magnetic tunnel junction (MTJ) and/or a giant magnetoresistance (GMR).

18. The magnetic field sensor of claim 12, wherein the MR element comprises an MR stack or MR pillar.

19. The magnetic field sensor of claim 12, further comprising a hard mask directly on to the MR element.

20. The magnetic field sensor of claim 12, wherein the substrate is a dielectric.

21. The magnetic field sensor of claim 20, further comprising an integrated circuit (IC),
    wherein the dielectric covers the IC.

22. The magnetic field sensor of claim 12, further comprising at least one via in the dielectric,
    wherein the at least one via in the dielectric electrically connects the metal layer to the IC.

* * * * *

UNITED STATES PATENT AND TRADEMARK OFFICE
CERTIFICATE OF CORRECTION

PATENT NO. : 11,630,169 B1
APPLICATION NO. : 17/648154
DATED : April 18, 2023
INVENTOR(S) : Yen Ting Liu et al.

It is certified that error appears in the above-identified patent and that said Letters Patent is hereby corrected as shown below:

In the Specification

Column 1, Line 42 delete "including" and replace with --includes--.

Column 3, Line 33 delete "MR 120" and replace with --MR element 120--.

Column 3, Line 55 delete "element 104." and replace with --element 120.--.

Column 5, Line 39 delete "material 109," and replace with --material 108,--.

Column 5, Line 44 delete "process covers" and replace with --process that covers--.

Column 6, Line 20 delete "layer 314" and replace with --layers 314--.

Column 6, Line 43 delete "layers 333" and replace with --layers 334--.

Column 6, Line 47 delete "includes" and replace with --include--.

Column 6, Line 51 delete "layer 330 includes" and replace with --layers 330 include--.

Column 8, Line 26 delete "14, the hard mask" and replace with --14, wherein the hard mask--.

Signed and Sealed this
Twenty-sixth Day of March, 2024

Katherine Kelly Vidal
*Director of the United States Patent and Trademark Office*